(12) United States Patent
Noda et al.

(10) Patent No.: US 12,040,179 B2
(45) Date of Patent: Jul. 16, 2024

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takaaki Noda, Toyama (JP); Kotaro Konno, Toyama (JP); Shingo Nohara, Toyama (JP); Takeo Hanashima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/073,084

(22) Filed: Mar. 17, 2016

(65) Prior Publication Data
US 2016/0284542 A1    Sep. 29, 2016

(30) Foreign Application Priority Data
Mar. 25, 2015   (JP) .................... 2015-063487

(51) Int. Cl.
*H01L 21/02*   (2006.01)
*C23C 16/40*   (2006.01)
(Continued)

(52) U.S. Cl.
CPC ...... *H01L 21/02274* (2013.01); *C23C 16/401* (2013.01); *C23C 16/45534* (2013.01);
(Continued)

(58) Field of Classification Search
CPC .............................................. C23C 16/45542
See application file for complete search history.

(56) References Cited

U.S. PATENT DOCUMENTS 5,679,215 A * 10/1997 Barnes ................ C23C 16/4405
  134/1.1
6,501,112 B1 * 12/2002 Sashida ............. H01L 27/10882
  257/295

(Continued)

FOREIGN PATENT DOCUMENTS

JP   2004-040110 A   2/2004
JP   2010-209465 A   9/2010
(Continued)

OTHER PUBLICATIONS

Won (IEEE Electron Device Letters. vol. 31, No. 8, Aug. 2010, pp. 857-859) (Year: 2010).*
(Continued)

*Primary Examiner* — Michael G Miller
(74) *Attorney, Agent, or Firm* — Volpe Koenig

(57) ABSTRACT

A technique of manufacturing a semiconductor device includes forming a film on a substrate in a process chamber by supplying a precursor and a reactant to the substrate under a first temperature at which the precursor and the reactant are not pyrolyzed, and purging, after performing the act of forming the film, an interior of the process chamber by supplying at least one selected from a group consisting of a plasma-excited gas, an alcohol, and a reducing agent into the process chamber under a second temperature equal to or lower than the first temperature.

19 Claims, 16 Drawing Sheets

(51) Int. Cl.
*C23C 16/455* (2006.01)
*H01J 37/32* (2006.01)

(52) U.S. Cl.
CPC .................. *C23C 16/45542* (2013.01); *H01J 37/32091* (2013.01); *H01J 37/3244* (2013.01); *H01J 37/32449* (2013.01); *H01J 37/32522* (2013.01); *H01L 21/02164* (2013.01); *H01L 21/02211* (2013.01); *H01L 21/02219* (2013.01); *H01L 21/02277* (2013.01); *H01L 21/0228* (2013.01)

(56) References Cited

U.S. PATENT DOCUMENTS

| | | | |
|---|---|---|---|
| 6,992,019 B2 | 1/2006 | Lee et al. | |
| 2004/0002220 A1 | 1/2004 | Mizushima | |
| 2006/0090694 A1* | 5/2006 | Cho | C23C 16/402 |
| | | | 117/104 |
| 2008/0081151 A1 | 4/2008 | Kobrin et al. | |
| 2010/0120245 A1 | 5/2010 | Tjandra et al. | |
| 2010/0189927 A1 | 7/2010 | Sato et al. | |
| 2010/0216306 A1 | 8/2010 | Yoshimi et al. | |
| 2011/0268887 A1 | 11/2011 | Shiratori et al. | |
| 2012/0064248 A1* | 3/2012 | Kojima | C23C 16/45525 |
| | | | 118/696 |
| 2015/0000695 A1 | 1/2015 | Noda et al. | |
| 2015/0044880 A1* | 2/2015 | Noda | H01L 21/02164 |
| | | | 438/778 |
| 2015/0087139 A1* | 3/2015 | O'Neill | C23C 16/24 |
| | | | 438/482 |
| 2015/0176126 A1* | 6/2015 | Ge | C23C 16/45574 |
| | | | 137/240 |
| 2015/0255581 A1* | 9/2015 | Lin | H01L 27/0886 |
| | | | 257/401 |

FOREIGN PATENT DOCUMENTS

| | | |
|---|---|---|
| JP | 2012-209585 A | 10/2012 |
| JP | 2015-012198 A | 1/2015 |
| WO | 2013/146632 A1 | 10/2013 |

OTHER PUBLICATIONS

Japanese Office Action issued on Sep. 12, 2018 for the Japanese Patent Application No. 2015-063487.
Non-Final Office Action issued on Jan. 6, 2021 for U.S. Appl. No. 16/434,288.
United States Office Action issued on Apr. 1, 2022 for U.S. Appl. No. 16/434,288.
Final Office Action issued on Oct. 15, 2021 for U.S. Appl. No. 16/434,288.
Non-Final Office Action dated Aug. 11, 2023 for U.S. Appl. No. 16/434,288.

* cited by examiner

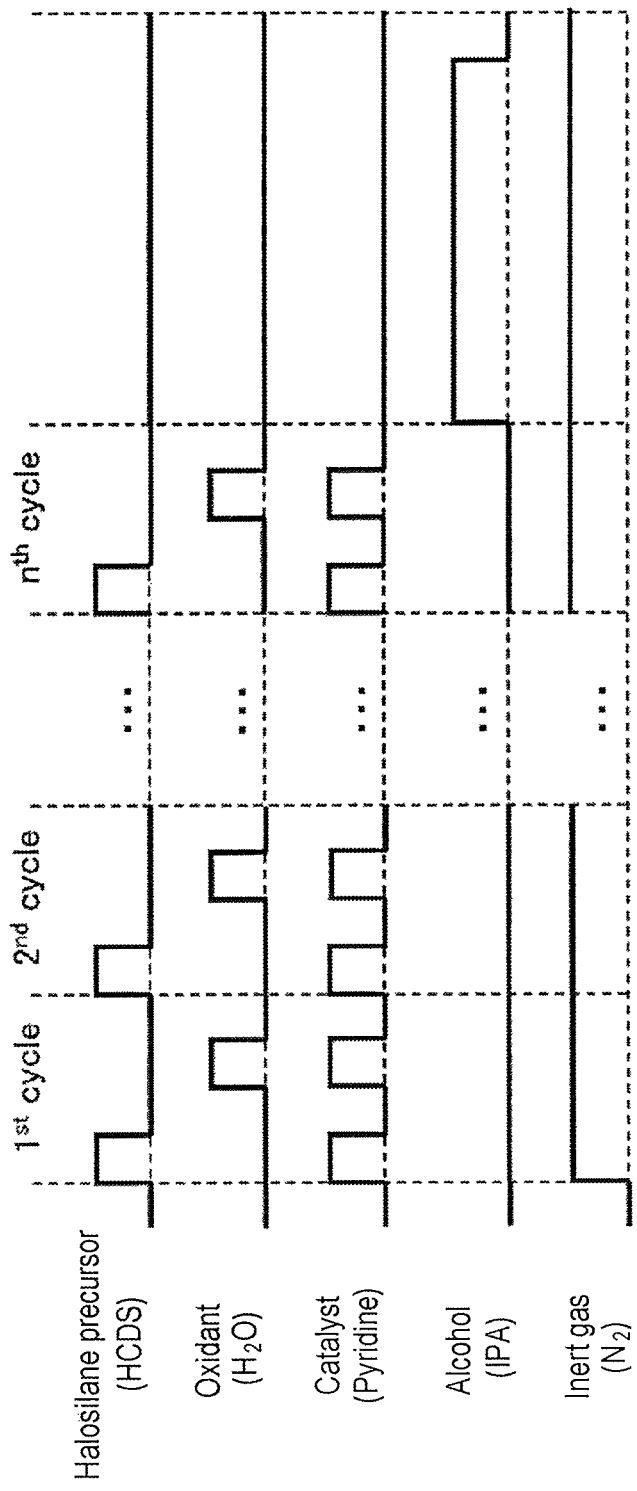

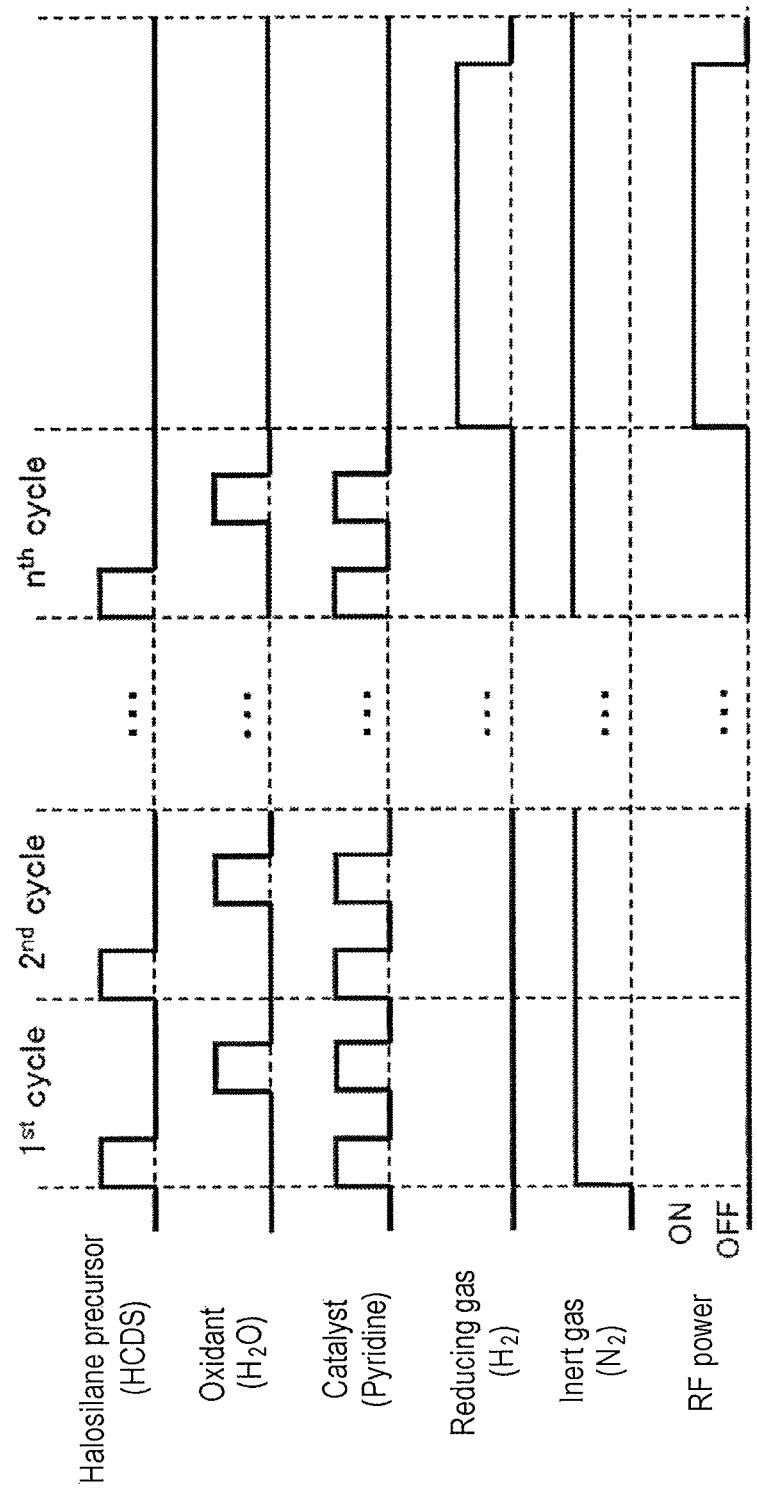

| Name | Pyridine | Aminopyridine | Picoline | Lutidine | Piperazine | Piperidine |
|---|---|---|---|---|---|---|
| Composition formula | $C_5H_5N$ | $C_5H_6N_2$ | $C_6H_7N$ | $C_7H_9N$ | $C_4H_{10}N_2$ | $C_5H_{11}N$ |
| Structural formula |  |  |  |  |  |  |
| Acid dissociation constant (pKa) | 5.67 | 6.89 | 6.07 | 6.96 | 9.80 | 11.12 |

Triethylamine (TEA)
Acid dissociation constant (pKa)  10.7

Diethylamine (DEA)
Acid dissociation constant (pKa)  10.9

Monoethylamine (MEA)
Acid dissociation constant (pKa)  10.6

Trimethylamine (TMA)
Acid dissociation constant (pKa)  9.8

Monomethylamine (MMA)
Acid dissociation constant (pKa)  10.6

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2015-063487, filed on Mar. 25, 2015, the entire contents of which are incorporated herein by reference.

TECHNICAL FIELD

The present disclosure relates to a method of manufacturing a semiconductor device, a substrate processing apparatus, and a recording medium.

BACKGROUND

As an example of procedures of manufacturing a semiconductor device, a procedure of supplying a precursor and a reactant to a substrate accommodated within a process chamber and forming a film on the substrate is often carried out.

SUMMARY

The present disclosure provides some embodiments of a technique capable of enhancing the productivity of a substrate processing process and stabilizing a deposition rate or the like.

According to one embodiment of the present disclosure, there is provided a technique, which includes forming a film on a substrate in a process chamber by supplying a precursor and a reactant to the substrate under a first temperature at which the precursor and the reactant are not pyrolyzed, and purging, after performing the act of forming the film, an interior of the process chamber by supplying at least one selected from a group consisting of a plasma-excited gas, an alcohol, and a reducing agent into the process chamber under a second temperature equal to or lower than the first temperature.

BRIEF DESCRIPTION OF THE DRAWINGS

FIG. 5A is a view illustrating a modification of the substrate processing sequence according to one embodiment of the present disclosure, FIG. 5C is a view illustrating a further modification of the substrate processing sequence according to one embodiment of the present disclosure.

DETAILED DESCRIPTION

One embodiment of the present disclosure will now be described in detail with reference to FIGS. 1 to 3.

(1) Configuration of Substrate Processing Apparatus

Figure 1:
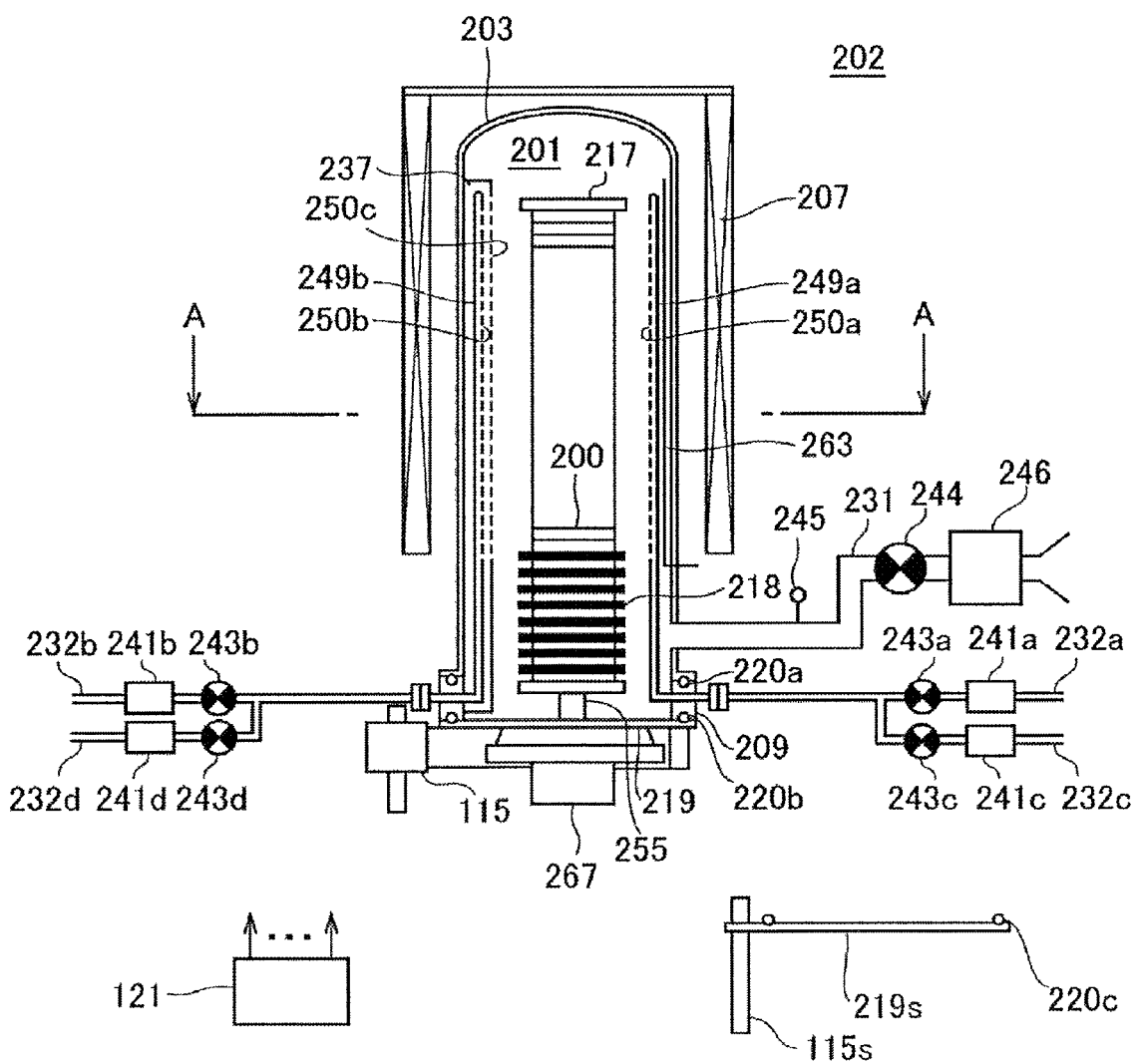
FIG. 1 is a schematic configuration view of a vertical processing furnace of a substrate processing apparatus suitably used in one embodiment of the present disclosure, in which a portion of the processing furnace is shown in a vertical cross section.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A processing vessel (reaction vessel) is mainly configured by the reaction tube 203 and the manifold 209. A process is formed in a hollow cylindrical portion of the processing vessel. The process chamber 201 is configured to accommodate a plurality of wafers 200 as substrates. The wafers 200 are horizontally stacked at multiple stages along a vertical direction in a boat 217 which will be described later.

Nozzles 249a and 249b are installed in the process chamber 201 so as to penetrate through the manifold 209. Gas supply pipes 232a and 232b are respectively connected to the nozzles 249a and 249b. In this way, the two nozzles 249a and 249b and the two gas supply pipes 232a and 232b are installed in the reaction tube 203 and are capable of supplying plural kinds of gases into the process chamber 201.

Mass flow controllers (MFC) 241a and 241b, which are flow rate controllers (flow rate control parts), and valves 243a and 243b, which are opening/closing valves, are installed in the gas supply pipes 232a and 232b sequentially from the corresponding upstream sides. Gas supply pipes 232c and 232d, which supply an inert gas, are respectively connected to the gas supply pipes 232a and 232b at the downstream side of the valves 243a and 243b. MFCs 241c and 241d, which are flow rate controllers (flow rate control parts), and valves 243c and 243d, which are opening/closing valves, are installed in the gas supply pipes 232c and 232d sequentially from the corresponding upstream sides.

The nozzle 249a is connected to an end portion of the gas supply pipe s 232a. As shown in FIG. 2, the nozzle 249a is disposed in an annular space between the inner wall of the reaction tube 203 and the wafers 200 such that the nozzle 249a extends upward along an arrangement direction of the wafers 200 from a lower portion of the inner wall of the reaction tube 203 to an upper portion thereof. Specifically, the nozzle 249a is installed along a wafer arrangement region in which the wafers 200 are arranged and in a region that horizontally surrounds the wafer arrangement region at a side of the wafer arrangement region. That is to say, the nozzle 249a is installed in a perpendicular relationship with the surfaces (flat surfaces) of the wafers 200 at a lateral side of the end portions (peripheral edge portions) of the wafers 200 carried into the process chamber 201. The nozzle 249a is configured as an L-shaped long nozzle. A horizontal portion of the nozzle 249a is installed to penetrate a sidewall of the manifold 209. A vertical portion of the nozzle 249a is installed to extend upward at least from one end portion of the wafer arrangement region toward the other end portion thereof. A plurality of gas supply holes 250a for supplying a gas is formed on the side surface of the nozzle 249a. Each of the gas supply holes 250a is opened toward the center of the reaction tube 203 to allow the gas to be supplied toward the wafers 200. The gas supply holes 250a may be formed in a plural number so as to span from the lower portion of the reaction tube 203 to the upper portion thereof. The respective gas supply holes 250a may have the same opening area and may be formed at the same opening pitch.

The nozzle 249b is connected to an end portion of the gas supply pipe 232b. The nozzle 249b is installed within a buffer chamber 237 which is a gas distribution space. As illustrated in FIG. 2, the buffer chamber 237 is installed in a space having an annular shape in a plane view defined between the inner wall of the reaction tube 203 and the wafers 200 and in a region spanning from the lower portion of the inner wall of the reaction tube 203 to the upper portion thereof, so as to extend along the stacking direction of the wafers 200. In other words, the buffer chamber 237 is installed at the lateral side of the wafer arrangement region and in a region horizontally surrounding the wafer arrangement region, so as to extend along the wafer arrangement region. Gas supply holes 250c configured to supply a gas are formed in the end portion of the wall of the buffer chamber 237 adjoining the wafers 200. The gas supply holes 250c are opened toward the center of the reaction tube 203 and are configured to supply a gas toward the wafers 200. The gas supply holes 250c are formed in a plural number so as to span from the lower portion of the reaction tube 203 to the upper portion thereof. The respective gas supply holes 250e may have the same opening area and may be formed at the same opening pitch.

The nozzle 249b is installed at the opposite end portion of the buffer chamber 237 from the end portion in which the gas supply holes 250c are formed, so as to extend upward in the stacking direction of the wafers 200 from the lower portion of the inner wall of the reaction tube 203 to the upper portion thereof. Specifically, the nozzle 249b is installed along the wafer arrangement region in which the wafers 200 are arranged and in a region that horizontally surrounds the wafer arrangement region. In other words, the nozzle 249b is installed at a lateral side of end portions of the wafers 200 carried into the process chamber 201, in a perpendicular relationship with the surfaces of the wafers 200. The nozzle 249b is configured as an L-shaped long nozzle. A horizontal portion of the nozzle 249b is installed to penetrate a sidewall of the manifold 209. A vertical portion of the nozzle 249b is installed to extend upward at least from one end portion of the wafer arrangement region toward the other end portion thereof. A plurality of gas supply holes 250b for supplying a gas is formed on the side surface of the nozzle 249b. The gas supply holes 250b are opened toward the center of the buffer chamber 237. Similar to the gas supply holes 250c, the gas supply holes 250b are formed in a plural number so as to span from the lower portion of the reaction tube 203 to the upper portion thereof. If a pressure difference between an interior of the buffer chamber 237 and an interior of the process chamber 201 is small, the gas supply holes 250b may be configured to have the same opening area. Further, the gas supply holes 250b may be formed at a regular opening pitch from an upstream side (i.e., a lower portion) to a downstream side (i.e., an upper portion). In contrast, if the pressure difference between the interior of the buffer chamber 237 and the interior of the process chamber 201 is large, the opening area of the gas supply holes 250b may be set to become gradually larger from the upstream side toward the downstream side. Alternatively or additionally, the opening pitch of the gas supply holes 250b may be set to become gradually smaller from the upstream side toward the downstream side.

By adjusting the opening area and the opening pitch of the gas supply holes 250b from the upstream side to the downstream side as described above, a gas may be injected from the respective gas supply holes 250b substantially at the same flow rate but at different flow velocities. The gas injected from the individual gas supply holes 250b is first introduced into the buffer chamber 237. This makes it possible to make uniform the flow velocities of the gas within the buffer chamber 237. The gas injected from the respective gas supply holes 250b into the buffer chamber 237 is ejected from the respective gas supply holes 250c into the process chamber 201 after the particle velocity is reduced in the buffer chamber 237. The gas which has been supplied into the buffer chamber 237 from the respective gas supply holes 250b has a uniform flow rate and a uniform flow velocity when ejected from the respective gas supply holes 250c into the process chamber 201.

As described above, in the present embodiment, a gas is transferred through the nozzles 249a and 249b, which are disposed in a vertically-elongated space having an annular shape in a plane view, i.e., a cylindrical space, defined by the inner surface of the sidewall of the reaction tube 203 and the end portions (peripheral edge portions) of the wafers 200 arranged within the reaction tube 203. The gas is initially injected into the reaction tube 203, near the wafers 200, through the gas supply holes 250a to 250c formed in the nozzles 249a and 249b and the buffer chamber 237. Accordingly, the gas supplied into the reaction tube 203 mainly flows within the reaction tube 203 in a direction parallel to surfaces of the wafers 200, i.e., in a horizontal direction. With this configuration, the gas can be uniformly supplied to the respective wafers 200. This makes it possible to improve the film thickness uniformity of a film formed on each of the wafers 200. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately specified depending on the position of the exhaust port.

A precursor gas including a predetermined element, for example, a silane precursor gas including silicon (Si) as the predetermined element, is supplied from the gas supply pipe 232a into the process chamber 201 via the MFC 241a, the valve 243a and the nozzle 249a.

The silane precursor gas refers to a gaseous silane precursor, for example, a gas obtained by vaporizing a silane precursor which remains in a liquid state under a room temperature and an atmospheric pressure, or a silane precursor which remains in a gas state under a room temperature and an atmospheric pressure. When the term "precursor" is used herein, it may refer to "a liquid precursor staying in a liquid state," "a precursor gas staying in a gaseous state," or both.

As the silane precursor gas, it may be possible to use, for example, a precursor gas including Si and an amino group (amine group), namely an aminosilane precursor gas. The aminosilane precursor is a silane precursor having an amino group, a silane precursor having an alkyl group such as a methyl group, an ethyl group, a butyl group or the like, and a precursor containing at least Si, nitrogen (N) and carbon (C). That is to say, the term "aminosilane precursor" used herein may be said to be an organic precursor or an organic aminosilane precursor.

Figure 6:
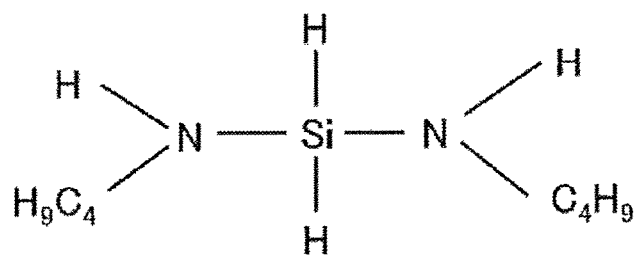
FIG. 6 is a view illustrating a chemical structural formula of BTBAS.

As the aminosilane precursor gas, it may be possible to use, for example, a bis-tert-butylaminosilane (SiH$_2$[NH(C$_4$H$_9$)]$_2$, abbreviation: BTBAS) gas. A chemical structural formula of BTBAS is illustrated in FIG. 6. The BTBAS gas may be said to be a precursor gas which includes one Si atom in one molecule and which includes a Si—N bond, a Si—H bond and a N—C bond but does not include a Si—C bond. The BTBAS gas acts as a Si source in the film forming process which will be described later. In addition, a tetrakisdimethylaminosilane (Si[N(CH$_3$)$_2$]$_4$, abbreviation: 4DMAS) gas, a trisdimethylaminosilane (Si[N(CH$_3$)$_2$]$_3$H, abbreviation: 3DMAS) gas, a bisdiethylaminosilane (Si[N(C$_2$H$_5$)$_2$]$_2$H$_2$, abbreviation: BDEAS) gas, or the like may be suitably used as the aminosilane precursor gas.

Furthermore, as the silane precursor gas, it may be possible to use, for example, a precursor gas including Si and a halogen group, namely a halosilane precursor gas. The halosilane precursor refers to a silane precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. The halosilane precursor may be said to be one kind of halide.

Figure 7A:
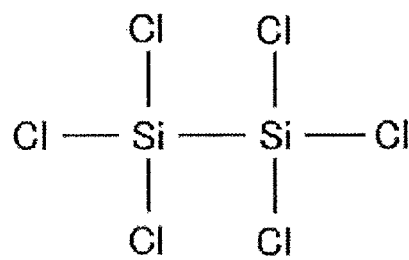
FIG. 7A is a view illustrating a chemical structural formula of HCDS.
Figure 7B:
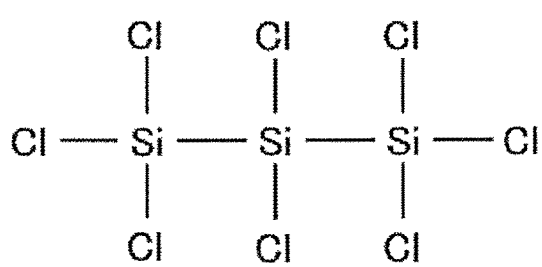
FIG. 7B is a view illustrating a chemical structural formula of OCTS.

As the halosilane precursor gas, it may be possible to use, for example, a C-free precursor gas containing Si and Cl, namely an inorganic chlorosilane precursor gas. As the inorganic chlorosilane precursor gas, it may be possible to use, for example, a hexachlorodisilane (Si$_2$Cl$_6$, abbreviation: HCDS) gas or an octachlorotrisilane (Si$_3$Cl$_8$, abbreviation: OCTS) gas. FIG. 7A illustrates a chemical structural formula of HCDS, and FIG. 7B illustrates a chemical structural formula of OCTS. These gases may be referred to as precursor gases which contain at least two Si atoms in one molecule and contain Cl and which have a Si—Si bond and a Si—Cl bond. These gases act as Si sources in a film forming process which will be described later.

Figure 8A:
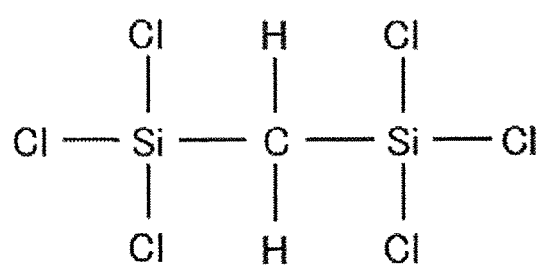
FIG. 8A is a view illustrating a chemical structural formula of BTCSM.
Figure 8B:
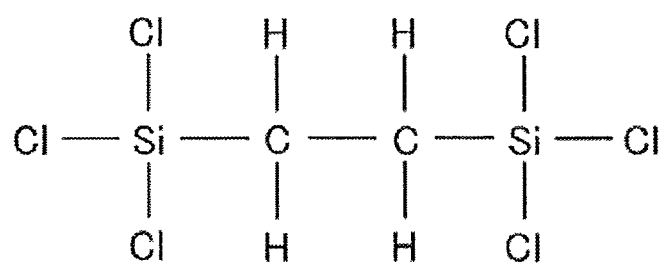
FIG. 8B is a view illustrating a chemical structural formula of BTCSE.

Furthermore, as the halosilane precursor gas, it may be possible to use, for example, a precursor gas containing Si, Cl and an alkylene group and having a Si—C bond, namely an alkylene chlorosilane precursor gas which is an organic chlorosilane precursor gas. The alkylene group includes a methylene group, an ethylene group, a propylene group, a butylene group, and so forth. The alkylene chlorosilane precursor gas may be referred to as an alkylene halosilane precursor gas. As the alkylene chlorosilane precursor gas, it may be possible to use, for example, a bis(trichlorosilyl)methane ((SiCl$_3$)$_2$CH$_2$, abbreviation: BTCSM) gas and an ethylene bis(trichlorosilane) gas, namely a 1,2-bis(trichlorosilyl)ethane ((SiCl$_3$)$_2$C$_2$H$_4$, abbreviation: BTCSE) gas. FIG. 8A illustrates a chemical structural formula of BTCSM, and FIG. 8B illustrates a chemical structural formula of BTCSE. These gases may be referred to as precursor gases which contain at least two Si atoms in one molecule and contain C and Cl and which have a Si—C bond, a Si—Cl bond and the like. These gases act as Si sources and C sources in a film forming process which will be described later.

Figure 9A:
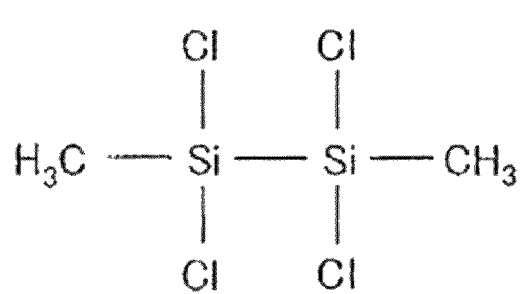
FIG. 9A is a view illustrating a chemical structural formula of TCDMDS.
Figure 9B:
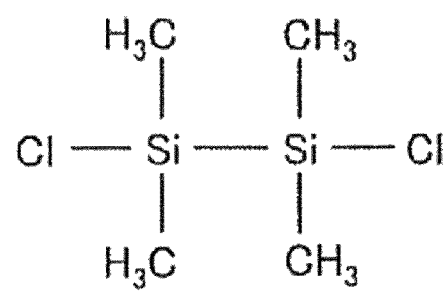
FIG. 9B is a view illustrating a chemical structural formula of DCTMDS.
Figure 9C:
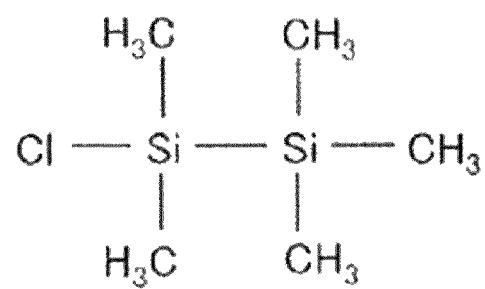
FIG. 9C is a view illustrating a chemical structural formula of MCPMDS.

Moreover, as the halosilane precursor gas, it may be possible to use, for example, a precursor gas containing Si, Cl and an alkyl group and having a Si—C bond, namely an alkyl chlorosilane precursor gas which is an organic chlorosilane precursor gas. The alkyl group includes a methyl group, an ethyl group, a propyl group, a butyl group, and so forth. The alkyl chlorosilane precursor gas may be referred to as an alkyl halosilane precursor gas. As the alkyl chlorosilane precursor gas, it may be possible to use, for example, a 1,1,2,2-tetrachloro-1,2-dimethyldisilane ((CH$_3$)$_2$Si$_2$Cl$_4$, abbreviation: TCDMDS) gas, a 1,2-dichloro-1,1,2,2-tetramethyldisilane ((CH$_3$)$_4$Si$_2$Cl$_2$, abbreviation: DCTMDS) gas, a 1-monochloro-1,1,2,2,2-pentamethyldisilane ((CH$_3$)$_5$Si$_2$Cl, abbreviation: MCPMDS) gas, or the like. FIG. 9A illustrates a chemical structural formula of TCDMDS, FIG. 9B illustrates a chemical structural formula of DCTMDS, and FIG. 9C illustrates a chemical structural formula of MCPMDS. These gases may be referred to as precursor gases which contain at least two Si atoms in one molecule and contain C and Cl and which have a Si—C bond. These gases further contain a Si—Si bond, Si—Cl bond and the like. These gases act as Si sources and C sources in a film forming process which will be described later.

In the case of using a liquid precursor, such as BTBAS, HCDS, BTCSM, TCDMDS or the like, which stays in a liquid state under a room temperature and an atmospheric pressure, the liquid precursor is vaporized by a vaporization system such as a vaporizer or a bubbler and is supplied as a silane precursor gas (a BTBAS gas, a HCDS gas, a BTCSM gas, a TCDMDS gas, etc.).

A reactant differing in chemical structure (molecular structure) from the precursor, for example, an oxygen (O)-containing gas, is supplied from the gas supply pipe 232b into the process chamber 201 via the MFC 241b, the valve 243b, the nozzle 249b and the buffer chamber 237.

The O-containing gas acts as an oxidant (oxidizing gas), namely an O source, in a film forming process which will be described later. As the O-containing gas, it may be possible to use, for example, an oxygen ($O_2$) gas, water vapor (a $H_2O$ gas) or the like. In the case of using an $O_2$ gas as the oxidant, the $O_2$ gas is plasma-excited using, for example, a plasma source which will be described later, and is supplied as a plasma-excited gas ($O_2^*$ gas). Furthermore, in the case of using an $H_2O$ gas as the oxidant, for example, pure water (or ultrapure water), such as RO (Reverse Osmosis) water from which impurities are removed using a reverse osmosis membrane, deionized water from which impurities are removed by performing a deionization treatment, distilled water from which impurities are removed through distillation using a distillation device, or the like, is vaporized by a vaporization system such as a vaporizer, a bubbler or a boiler and is supplied as a $H_2O$ gas.

Furthermore, the O-containing gas (oxidant) acts as a purge gas for improving the efficiency of removal of a residue from the interior of the process chamber 201, in a reactive purge process which will be described later. In the case of using an $O_2$ gas as the purge gas, the $O_2$ gas is plasma-excited using, for example, a plasma source which will be described later, and is supplied as a plasma-excited gas ($O_2^*$ gas).

An alcohol is supplied from the gas supply pipe 232b into the process chamber 201 via the MFC 241b, the valve 243b, the nozzle 249b and the buffer chamber 237. The alcohol acts as a purge gas for improving the efficiency of removal of a residue from the interior of the process chamber 201, in a reactive purge process which will be described later. As the alcohol, it may be possible to use, for example, isopropyl alcohol (($CH_3$)$_2$CHOH, abbreviation: IPA). In the case of using an alcohol such as IPA or the like, which stays in a liquid state under a room temperature and an atmospheric pressure, the liquid alcohol is vaporized by a vaporization system such as a vaporizer, a bubbler or the like and is supplied as an alcohol gas (IPA gas).

A reducing agent is supplied from the gas supply pipe 232b into the process chamber 201 via the MFC 241b, the valve 243b, the nozzle 249b and the buffer chamber 237. The reducing agent acts as a purge gas for improving the efficiency of removal of a residue from the interior of the process chamber 201, in a reactive purge process which will be described later. As the reducing agent, it may be possible to use, for example, silicon hydride such as a silane ($SiH_4$) gas or the like, or an H-containing gas such as a hydrogen ($H_2$) gas or the like. In the case of using an $H_2$ gas as the purge gas, the $H_2$ gas is plasma-excited using a plasma source which will be described later, and is supplied as a plasma-excited gas ($H_2^*$ gas).

Furthermore, a catalyst for promoting a film forming reaction generated by the precursor and the reactant described above is supplied from the gas supply pipes 232a and 232b into the process chamber 201 via the MFCs 241a and 241b, the valves 243a and 243b, the nozzles 249a and 249b and the buffer chamber 237. As the catalyst, it may be possible to use, for example, an amine-based gas including C, N and H.

The amine-based gas is a gas which includes amine obtained by substituting at least one of H atoms of ammonia ($NH_3$) with a hydrocarbon group such as an alkyl group or the like. As illustrated in FIGS. 10A to 10F, amine which includes N having a lone pair of electrons and which has an acid dissociation constant (hereinafter also referred to as pKa) of, for example, about 5 to 11 may be suitably used as a catalyst. The acid dissociation constant (pKa) is one index quantitatively indicating the strength of an acid. The acid dissociation constant (pKa) refers to a negative common logarithm which represents an equilibrium constant Ka in a dissociation reaction in which H ions are released from an acid. As the amine-based gas, it may be possible to use a cyclic amine-based gas in which hydrocarbon groups have a cyclic shape, or a chain amine-based gas in which hydrocarbon groups have a chain shape.

Figure 10A:
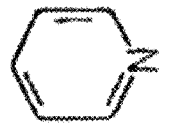
FIG. 10A is a view illustrating chemical structural formulae of cyclic amine.
Figure 10A:
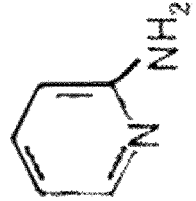
Figure 10A:
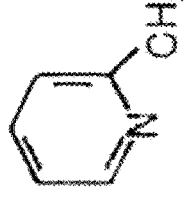
Figure 10A:
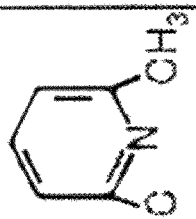
Figure 10A:
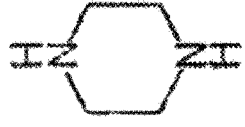
Figure 10A:
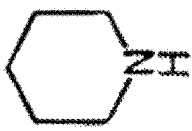
Figure 10B:
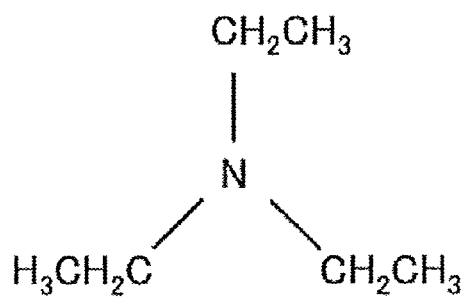
FIG. 10B is a view illustrating a chemical structural formula of TEA which is chain amine.
Figure 10C:
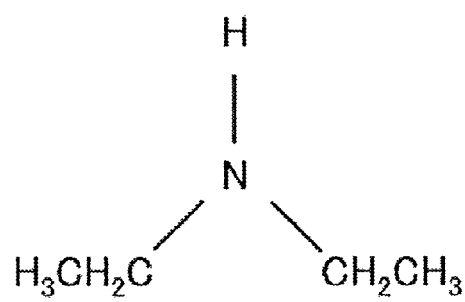
FIG. 10C is a view illustrating a chemical structural formula of DEA which is chain amine.
Figure 10D:
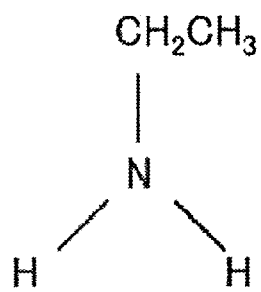
FIG. 10D is a view illustrating a chemical structural formula of MEA which is chain amine.
Figure 10E:
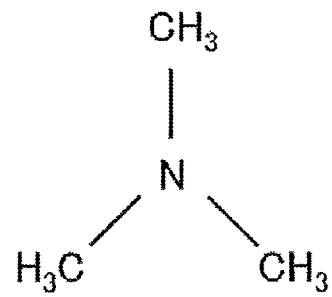
FIG. 10E is a view illustrating a chemical structural formula of TMA which is chain amine.
Figure 10F:
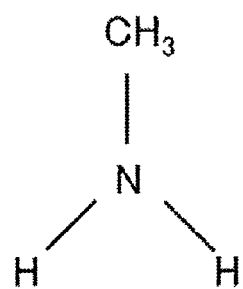
FIG. 10F is a view illustrating a chemical structural formula of MMA which is chain amine.

As the cyclic amine-based gas, it may be possible to use, for example, a pyridine ($C_5H_5N$, pKa=5.67) gas, an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, or a piperidine ($C_5H_{11}N$, pKa=11.12) gas, as illustrated in FIG. 10A. It can be said that the cyclic amine-based gas is a heterocyclic compound whose cyclic structure is formed by plural kinds of elements such as C and N, namely an N-containing heterocyclic compound.

As the chain amine-based gas, it may be possible to use, for example, a triethylamine (($C_2H_5$)$_3$N, abbreviation: TEA, pKa=10.7) gas, a diethylamine (($C_2H_5$)$_2$NH, abbreviation: DEA, pKa=10.9) gas, a monoethylamine (($C_2H_5$)$NH_2$, abbreviation: MEA, pKa=10.6) gas, a trimethylamine (($CH_3$)$_3$N, abbreviation: TMA, pKa=9.8) gas, or a monomethylamine (($CH_3$)$NH_2$, abbreviation: MMA, pKa=10.6) gas, as illustrated in FIGS. 10B to 10F.

The amine-based gas acting as a catalyst may be referred to as an amine-based catalyst or an amine-based catalyst gas. As the catalyst gas, in addition to the amine-based gas mentioned above, it may be possible to use a non-amine-based gas, e.g., an ammonia ($NH_3$, pKa=9.2).

It is sometimes the case that the molecular structure of the catalyst illustrated herein is partially decomposed in a film forming process which will be described later. Such a substance which partially undergoes a change before and after a chemical reaction is not a "catalyst" in a strict meaning. However, in the subject specification, a substance which is partially decomposed but not mostly decomposed in the course of a chemical reaction and which changes a reaction speed and substantially acts as a catalyst will be referred to as a "catalyst".

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b, the nozzles 249a and 249b and the buffer chamber 237.

In the case of supplying the aforementioned precursor from the gas supply pipe 232a in a film forming process which will be described later, a precursor supply system as a first supply system is mainly configured by the gas supply pipe 232a, the MFC 241a and the valve 243a. The precursor supply system may further include the nozzle 249a. In the case of supplying an aminosilane precursor from the gas supply pipe 232a, the precursor supply system may be referred to as an aminosilane precursor supply system or an aminosilane precursor gas supply system. Furthermore, in the case of supplying a halosilane precursor from the gas supply pipe 232a, the precursor supply system may be referred to as a halosilane precursor supply system or a halosilane precursor gas supply system.

Furthermore, in the case of supplying the aforementioned reactant from the gas supply pipe 232b in a film forming process which will be described later, a reactant supply system as a second supply system is mainly configured by the gas supply pipe 232b, the MFC 241b and the valve 243b. The reactant supply system may further include the nozzle 249b and the buffer chamber 237. In the case of supplying an oxidant from the gas supply pipe 232b, the reactant supply system may be referred to as an oxidant supply system, an oxidizing gas supply system or an O-containing gas supply system.

Moreover, in the case of supplying the aforementioned catalyst from the gas supply pipes 232a and 232b in a film forming process which will be described later, a catalyst supply system is mainly configured by the gas supply pipes 232a and 232b, the MFCs 241a and 241b and the valves 243a and 243b. The catalyst supply system may further include the nozzles 249a and 249b and the buffer chamber 237. The catalyst supply system may be referred to as a catalyst gas supply system. In the case of supplying an amine-based gas from the gas supply pipes 232a and 232b, the catalyst supply system may be referred to as an amine-based catalyst supply system, an amine supply system or an amine-based gas supply system.

Furthermore, in the case of supplying at least one selected from a group consisting of an oxidant, an alcohol, and a reducing agent from the gas supply pipe 232b in a reactive purge process which will be described later, a reactive purge gas supply system as a third supply system is configured by the gas supply pipe 232b, the MFC 241b and the valve 243b. The reactive purge gas supply system may further include the nozzle 249b and the buffer chamber 237. In the case of plasma-exciting an oxidant or a reducing agent supplied from the reactive purge gas supply system and then supplying the oxidant or the reducing agent into the process chamber 201, the reactive purge gas supply system may further include a plasma source which will be described later. The reactive purge gas supply system including the plasma source may be referred to as a plasma-excited gas supply system.

In addition, an inert gas supply system is mainly configured by the gas supply pipes 232c and 232d, the MFCs 241c and 241d and the valves 243c and 243d.

Figure 2:
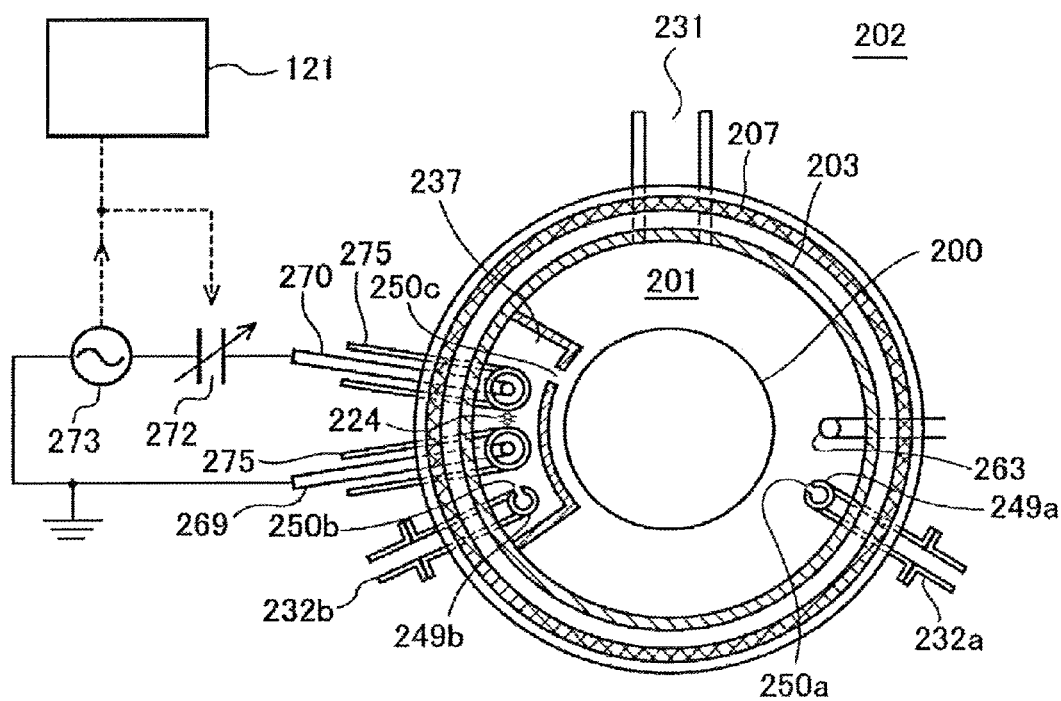
FIG. 2 is a schematic configuration view of the vertical processing furnace of the substrate processing apparatus suitably used in one embodiment of the present disclosure, in which a portion of the processing furnace is shown in a cross section taken along line A-A in FIG. 1.

In the buffer chamber 237, as illustrated in FIG. 2, two rod-shaped electrodes 269 and 270, which are made of a conductor and which have an elongated structure, are disposed along the stacking direction of the wafers 200 to span from the lower portion of the reaction tube 203 to the upper portion thereof. Each of the rod-shaped electrodes 269 and 270 is disposed parallel to the nozzle 249b. Each of the rod-shaped electrodes 269 and 270 is covered with and protected by an electrode protection tube 275 over a region spanning from an upper portion to a lower portion thereof. One of the rod-shaped electrodes 269 and 270 is connected to a high-frequency power source 273 via a matcher 272, and the other is connected to ground having a reference electric potential. By applying high-frequency (RF) power from the high-frequency power source 273 to between the rod-shaped electrodes 269 and 270, plasma is generated in a plasma generation region 224 between the rod-shaped electrodes 269 and 270. A plasma source as a plasma generator (plasma generating part) includes the rod-shaped electrodes 269 and 270 and the electrode protection tubes 275. The matcher 272 and the high-frequency power source 273 may also be included in the plasma source. As will be described later, the plasma source functions as an plasma exciting part (an activating mechanism) that plasma-excites a gas, namely excites (activates) a gas into a plasma state.

The electrode protection tube 275 has a structure in which each of the rod-shaped electrodes 269 and 270 can be inserted into the buffer chamber 237 while keeping each of the rod-shaped electrodes 269 and 270 isolated from an internal atmosphere of the buffer chamber 237. If an O concentration within the electrode protection tube 275 is substantially equal to an O concentration in the ambient air (atmosphere), each of the rod-shaped electrodes 269 and 270 inserted into the electrode protection tubes 275 is oxidized by the heat generated from the heater 207. By charging the interior of the electrode protection tubes 275 with an inert gas such as a $N_2$ gas or the like, or by purging the interior of the electrode protection tubes 275 with an inert gas such as a $N_2$ gas or the like through the use of an inert gas purge mechanism, it is possible to reduce the O concentration within the electrode protection tubes 275, thereby preventing oxidation of the rod-shaped electrodes 269 and 270.

An exhaust pipe 231 for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an auto pressure controller (APC) valve 244, which is an exhaust valve (pressure regulating part). The APC valve 244 is configured to perform or stop vacuum exhaust in the process chamber 201 by opening or closing the valve while keeping the vacuum pump 246 actuated and is also configured to regulate the internal pressure of the process chamber 201 by adjusting an opening degree of the valve pursuant to pressure information detected by the pressure sensor 245 while keeping the vacuum pump 246 actuated. An exhaust system is mainly configured by the exhaust pipe 231, the APC valve 244 and the pressure sensor 245. The exhaust system may further include the vacuum pump 246. Similar to the nozzles 249a and 249b, the exhaust pipe 231 may be installed in the manifold 209 instead of installing the exhaust pipe 231 in the reaction tube 203.

A seal cap 219, which serves as a furnace opening cover configured to hermetically seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed into a disc shape. An O-ring 220b, which is a seal member making contact with the lower end portion of the manifold 209, is installed on an upper surface of the seal cap 219. A rotary mechanism 267 configured to rotate a boat 217, which will be described later is installed at a side of the seal cap 219 apposite to the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, ultimately, the wafers 200, into and out of the process chamber 201. Under the manifold 209, there is installed a shutter 219s as a furnace opening cover capable of hermetically sealing the lower end opening of the manifold 209 during the time when the seal cap 219 is moved down by the boat elevator 115. The shutter 219s is made of, for example, metal such as stainless steel or the like and is formed in a disc shape. On the upper surface of the shutter 219s, there is installed an O-ring 220c as a seal member which makes contact with the lower end portion of the manifold 209. An opening/closing operation (an elevating operation, a rotating operation, etc.) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in multiple stages. With this configuration, it is hard for heat generated from the heater 207 to be transferred to the seal cap 219. However, the present embodiment is not limited to this configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired or specified temperature distribution. Similar to the nozzles 249a and 249b, the temperature sensor 263 is formed in an L-shape. The temperature sensor 263 is installed along the inner wall of the reaction tube 203.

Figure 3:
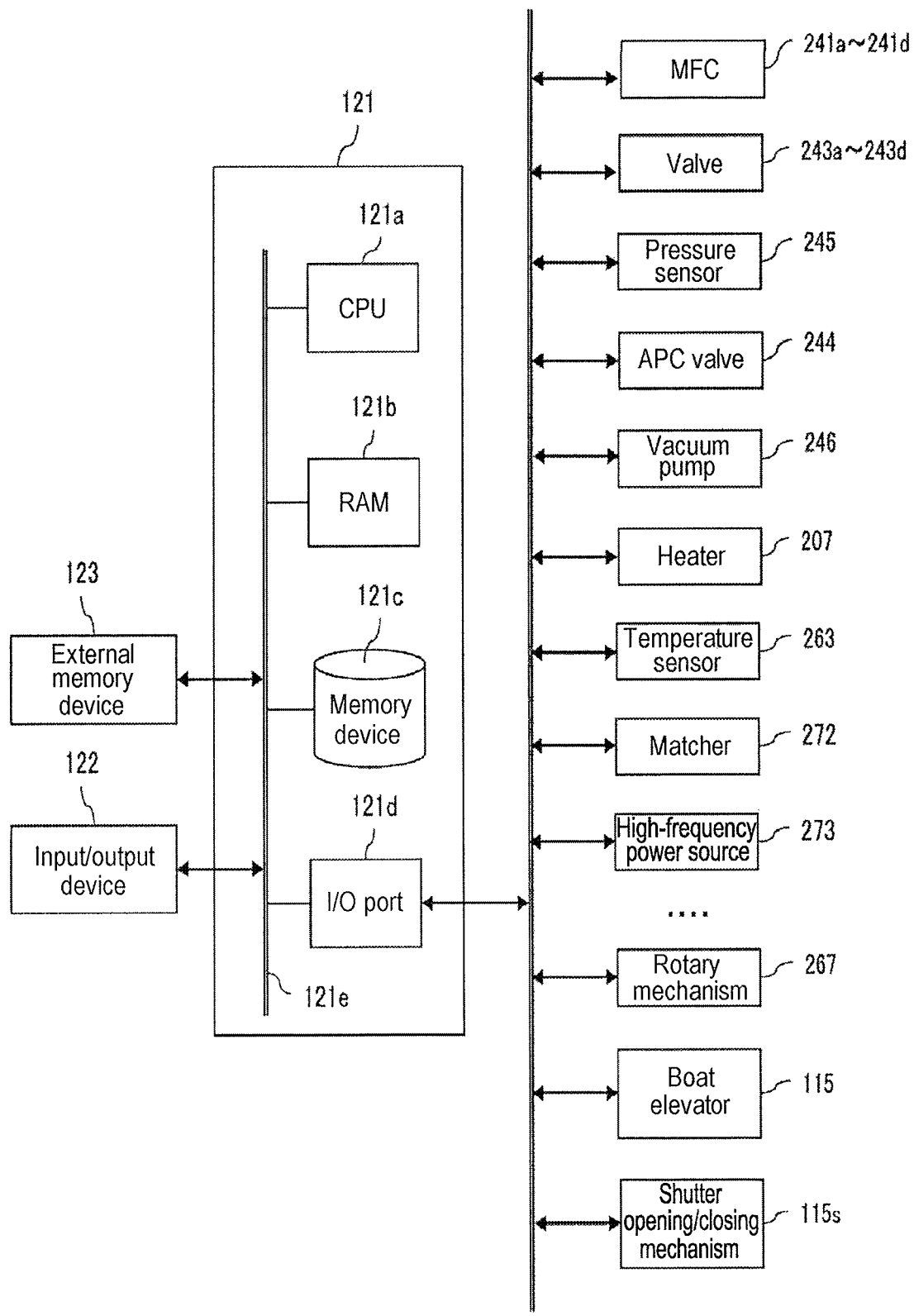
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disc drive (HDD), or the like. A control program for controlling operations of a substrate processing apparatus, a process recipe in which a sequence or condition of a film forming process to be described later is written, and a purge recipe in which a sequence or condition of a reactive purge process to be described later is written, are readably stored in the memory device 121c. The process recipe and the purge recipe function as programs which cause the controller 121 to execute respective sequences in various kinds of processes (a film forming process and a reactive purge process), which will be described later, to obtain a predetermined result. Hereinafter, the process recipe, the purge recipe and the control program will be generally and simply referred to as a "program". Furthermore, the process recipe and the purge recipe will be simply referred to as a "recipe". When the term "program" is used herein, it may refer to a case of including only a recipe, a case of including only a control program, or a case of including both a recipe and a control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotary mechanism 267, the boat elevator 115, the shutter opening/closing mechanism 115s, the matcher 272, the high-frequency power source 273, and the like.

The CPU 121a is configured to read and execute the control program from the memory device 121c. The CPU 121a is also configured to read the recipe from the memory device 121c according to an input of an operation command from the input/output device 122. The CPU 121a is configured to, according to contents of the read recipe, control the flow rate adjusting operation of various kinds of gases performed by the MFCs 241a to 241d, the opening/closing operation of the valves 243a to 243d, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the rotation and rotation speed adjusting operation of the boat 217 performed by the rotary mechanism 267, the elevation operation of the boat 217 performed by the boat elevator 115, the opening/closing operation of the shutter 219s performed by the shutter opening/closing mechanism 115s, the impedance adjusting operation performed by the matcher 272, the power supply operation of the high-frequency power source 273, and the like.

The controller 121 may be configured by installing into a computer the aforementioned program stored in an external memory device 123 (for example, a magnetic tape, a magnetic disc such as a flexible disc or a hard disc, an optical disc such as a CD or a DVD, a magneto-optical disc such as an Moreover, or the like, a semiconductor memory such as a USB memory or a memory card). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. In addition, the program may be provided to the computer using a communication means such as the Internet or a dedicated line without having to use the external memory device 123.

(2) Substrate Processing

An example of a sequence for forming a film on a substrate and then purging the interior of the process chamber 201, which is one of the processes for manufacturing a semiconductor device by using the aforementioned substrate processing apparatus, will now be described with reference to FIG. 4. In the following descriptions, the operations of the respective parts constituting the substrate processing apparatus are controlled by the controller 121.

Figure 4:
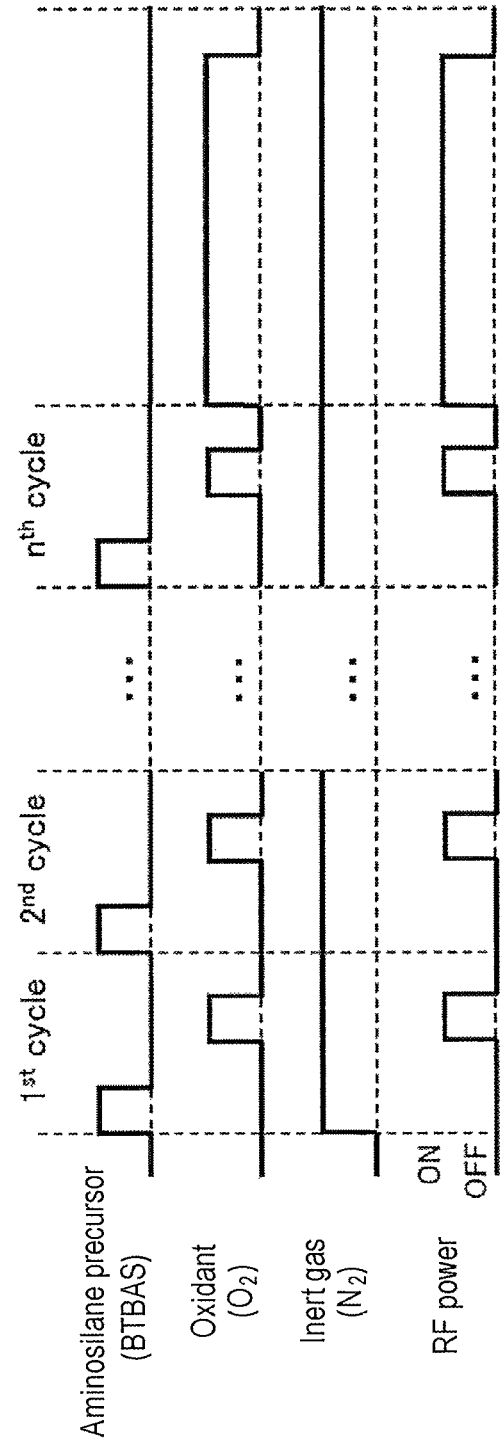
FIG. 4 is a view illustrating a substrate processing sequence according to one embodiment of the present disclosure.

In the substrate processing illustrated in FIG. 4, there are performed a process (film forming process) of foil ling a film on the wafer 200 as a substrate accommodated within the process chamber 201 by supplying a precursor and a reactant to the wafer 200 under a first temperature at which the precursor and the reactant are not pyrolyzed, and a process (reactive purge process) of purging the interior of the process chamber 201 by supplying at least one selected from a group consisting of a plasma-excited gas, an alcohol, and a reducing agent into the process chamber which has performed the film forming process, under a second temperature equal to or lower than the first temperature.

In the film forming process illustrated in FIG. 4, a silicon oxide film (SiO film) as a Si- and O-containing film is formed on the wafer 200 by non-simultaneously, i.e., non-synchronously performing a predetermined number of times (once or more) a step of supplying a BTBAS gas as the precursor to the wafer 200 accommodated within the process chamber 201, and a step of supplying a plasma-excited $O_2$ gas as the reactant to the wafer 200 accommodated within the process chamber 201.

In the subject specification, for the sake of convenience, the film forming sequence illustrated in FIG. 4 may sometimes be indicated as follows. The same indication will be used in describing modifications and other embodiments later.

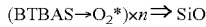

$(BTBAS \rightarrow O_2^*) \times n \Rightarrow SiO$

In the reactive purge process illustrated in FIG. 4, the substance such as BTBAS or the like remaining within the process chamber 201 is removed from the interior of the process chamber 201 by supplying the plasma-excited $O_2$ gas as a plasma-excited gas into the process chamber 201 which has performed the film forming process. In the subject specification, the reactive purge process will also be referred to as a plasma purge process or an active gas purge process.

As used herein, the term "wafer" may refer to "a wafer itself" or "a laminated body (an assembly) of a wafer and a predetermined layer or film formed on a surface of the wafer" (namely, a wafer including a predetermined layer or film formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of a wafer as a laminated body".

As used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer."

(Loading Step)

If a plurality of wafers 200 is charged to the boat 217 (wafer charging), the shutter 219s is moved by the shutter opening/closing mechanism 115s and the lower end opening of the manifold 209 is opened (shutter open). Thereafter, as illustrated in FIG. 1, the boat 217 charged with the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment Step)

The interior of the process chamber 201, namely the space in which the wafers 200 exist, is vacuum-exhausted (de-pressurization-exhausted) by the vacuum pump 246 so as to reach a desired or specified pressure (desired or specified vacuum level). In this operation, the internal pressure of the process chamber 201 is measured by the pressure sensor 245. The APC valve 244 is feedback-controlled based on the measured pressure information. The vacuum pump 246 may be continuously activated at least until the below-described reactive purge process is completed.

The wafers 200 in the process chamber 201 are heated by the heater 207 to a desired or specified temperature. In this operation, the state of supplying electric power to the heater 207 is feedback-controlled based on the temperature information detected by the temperature sensor 263 such that the interior of the process chamber 201 has a desired or specified temperature distribution. The heating of the interior of the process chamber 201 by the heater 207 may be continuously performed at least until the below-described reactive purge process is completed. In the case where the film forming process and the reactive purge process, which will be described later, are performed under a temperature condition of a room temperature or less, the heating of the interior of the process chamber 201 by the heater 207 may not be performed. Furthermore, in the case of merely performing the processes under this temperature, the heater 207 is unnecessary. Thus, the heater 207 may not be installed in the substrate processing apparatus. In this case, it is possible to simplify the configuration of the substrate processing apparatus.

Subsequently, the boat 217 and the wafers 200 begin to be rotated by the rotary mechanism 267. The rotation of the boat 217 and the wafers 200 performed by the rotary mechanism 267 may be continuously performed at least until the below-described reactive purge process is completed.

(Film Forming Process)

Thereafter, the following two steps, namely steps 1 and 2, are sequentially performed.

[Step 1]

At this step, a BTBAS gas is supplied to the wafers 200 accommodated within the process chamber 201.

The valve 243a is opened to allow the BTBAS gas to flow through the gas supply pipe 232a. The flow rate of the BTBAS gas is adjusted by the MFC 241a. The BTBAS gas is supplied into the process chamber 201 via the nozzle 249a and is exhausted from the exhaust pipe 231. At this time, the BTBAS gas is supplied to the wafers 200. At the same time, the valve 343c is opened to allow an $N_2$ gas to flow through the gas supply pipe 232c. The flow rate of the $N_2$ gas is adjusted by the MFC 241c. The $N_2$ gas and the BTBAS gas are supplied into the process chamber 201 and are exhausted from the exhaust pipe 231.

In order to prevent the BTBAS gas from entering the buffer chamber 237 or the nozzle 249b, the valve 243d is opened to allow the $N_2$ gas to flow through the gas supply pipe 232d. The $N_2$ gas is supplied into the process chamber 201 via the gas supply pipe 232b, the nozzle 249b and the buffer chamber 237 and is exhausted from the exhaust pipe 231.

The supply flow rate of the BTBAS gas controlled by the MFC 241a is set to fall within a range of, for example, 1 to 2,000 sccm, specifically 10 to 1,000 sccm. The supply flow rates of the $N_2$ gas controlled by the MFCs 241c and 241d are respectively set to fall within a range of, for example, 100 to 10,000 sccm. The internal pressure of the process chamber 201 is set to fall within a range of, for example, 1 to 2,666 Pa, specifically 67 to 1,333 Pa. The time period for supplying the BTBAS gas to through wafers 200, namely the gas supply time (irradiation time), is set to fall within a range of, for example, 1 to 100 seconds, specifically 1 to 50 seconds.

The temperature of the heater 207 is set such that the temperature of the wafers 200 becomes a temperature (first temperature) which falls within a range of, for example, 0 degrees C. or more and 150 degrees C. or less, specifically a room temperature (25 degrees C.) or more and 100 degrees C. or less, more specifically 40 degrees C. or more and 90 degrees C. or less. The BTBAS gas is a gas which is easily adsorbed to the wafers 200 and which is high in reactivity. Thus, for example, even under a temperature substantially equal to a room temperature, it is possible to allow the BTBAS gas to be chemisorbed onto the wafers 200 and to achieve a practical deposition rate. By setting the temperature of the wafers 200 at 150 degrees C. or less, ultimately 100 degrees C. or less, more ultimately 90 degrees C. or less as in the present embodiment, it is possible to reduce the amount of heat applied to the wafers 200 and to satisfactorily execute the control of a thermal history of the wafers 200. Under a temperature of 0 degrees C. or more, it is possible to have BTBAS sufficiently adsorbed onto the wafers 200 and to achieve a sufficient deposition rate. Accordingly, the temperature of the wafers 200 may be set to fall within a range of 0 degrees C. or more and 150 degrees C. or less, specifically a room temperature or more and 100 degrees C. or less, more specifically 40 degrees C. or more and 90 degrees C. or less.

By supplying the BTBAS gas to the wafer 200 under the aforementioned conditions, an Si-containing layer having a thickness of, for example, from less than one atomic layer to several atomic layer is formed on the wafer 200 (a base film of the surface of the wafer 200). The Si-containing layer may be a Si layer or an adsorption layer of BTBAS and may include both the Si layer and the adsorption layer of BTBAS.

The term "Si layer" is a generic name that encompasses a continuous layer and a discontinuous layer, which are composed of Si, and a Si thin film, which is formed of the continuous layer and the discontinuous layer overlapping with each other. The continuous layer composed of Si is sometimes referred to as a Si thin film. The Si which constitutes the Si layer includes not only Si whose bond to an amino group (N) is not completely broken, but also Si whose bond to H is not completely broken.

The adsorption layer of BTBAS includes not only a continuous adsorption layer composed of BTBAS molecules but also a discontinuous adsorption layer. That is to say, the adsorption layer of BTBAS includes an adsorption layer having a thickness of one molecular layer or a less than one molecular layer, which is composed of BTBAS molecules. The BTBAS molecules that constitute the adsorption layer of BTBAS include not only a BTBAS molecule having a chemical structural formula illustrated in FIG. 6 but also a BTBAS molecule in which bonds of Si and an amino group are partially broken, a BTBAS molecule in which bonds of Si and H are partially broken and a BTBAS molecule in which bonds of N and C (alkyl group) are partially broken. That is to say, the adsorption layer of BTBAS may be a physical adsorption layer of BTBAS or a chemisorption layer of BTBAS and may include both the physical adsorption layer of BTBAS and the chemisorption layer of BTBAS.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer may include both a Si layer and an adsorption layer of BTBAS. As described above, the expressions such as "one atomic layer", "several atomic layers" and the like will be used with respect to the Si-containing layer.

Under a condition in which BTBAS is autolyzed (or pyrolyzed), i.e., a condition in which a pyrolysis reaction of BTBAS is generated, Si is deposited on the wafer 200 to form a Si layer. Under a condition in which BTBAS is not autolyzed (or pyrolyzed), i.e., a condition in which a pyrolysis reaction of BTBAS is not generated, BTBAS is adsorbed onto the wafer 200 to form an adsorption layer of BTBAS. In the present embodiment, the pyrolysis of BTBAS is difficult to occur because the temperature of the wafer 200 is set at a low temperature (first temperature) of, for example, 150 degrees C. or less. As a consequence, an adsorption layer of BTBAS rather than a Si layer is easily formed on the wafer 200.

If the thickness of the Si-containing layer formed on the wafer 200 exceeds several atomic layers, a modifying reaction at step 2, which will be described later, does not affect the entire Si-containing layer. In addition, a minimum value of the thickness of the Si-containing layer is less than one atomic layer. Accordingly, the thickness of the Si-containing layer may be set to fall within a range of less than one atomic layer to several atomic layers. By setting the thickness of the Si-containing layer to become equal to or less than one atomic layer, i.e., at one atomic layer or less than one atomic layer, it is possible to relatively increase the modifying action at step 2, which will be described later, and to shorten the time required in the modifying reaction at step 2. It is also possible to shorten the time required in forming the Si-containing layer at step 1. As a result, a processing time per cycle can be shortened, and a total processing time can also be shortened. That is to say, the deposition rate can be increased. In addition, if the thickness of the Si-containing layer is set at one atomic layer or less, it is possible to improve the controllability of the film thickness uniformity.

After the Si-containing layer is formed, the valve 243a is closed to stop the supply of the BTBAS gas into the process chamber 201. At this time, while keeping the APC valve 244 opened, the interior of the process chamber 201 is evacuated by the vacuum pump 246. The BTBAS gas remaining within the process chamber 201, which has not reacted or which has contributed to the formation of the Si-containing layer, and the reaction byproducts remaining within the process chamber 201, are removed from the interior of the process chamber 201. At this time, while keeping the valves 243c and 243d opened, the supply of the $N_2$ gas into the process chamber 201 is maintained. The $N_2$ gas acts as a purge gas. This makes it possible to effectively remove the BTBAS gas remaining within the process chamber 201, which has not reacted or which has contributed to the formation of the Si-containing layer, from the interior of the process chamber 201.

In this operation, the gas remaining within the process chamber 201 may not be completely removed and the interior of the process chamber 201 may not be completely purged. If the amount of the gas remaining within the process chamber 201 is small, an adverse effect may not be generated at step 2, which will be subsequently performed.

The flow rate of the $N_2$ gas supplied into the process chamber 201 need not be made large. For example, an amount of the $N_2$ gas to be supplied into the process chamber 201 may be substantially equal to the volume of the reaction tube 203 (the process chamber 201) such that a purge operation can be performed without causing an adverse effect at step 2. By not completely purging the interior of the process chamber 201 in this way, it is possible to shorten the purge time and to improve the throughput. It is also possible to suppress the consumption of the $N_2$ gas to a necessary minimum level.

As the precursor, in addition to the BTBAS gas, it may be possible to suitably use various kinds of aminosilane precursor gas such as a tetrakisdimethylaminosilane (4DMAS) gas, a trisdimethylaminosilane (3DMAS) gas, a bisdimethylaminosilane (BDMAS) gas, a bisdiethylaminosilane (BDEAS) gas, a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, and the like.

As the inert gas, in addition to the $N_2$ gas, it may be possible to use a rare gas such as an Ar gas, a He gas, a Ne gas, a Xe gas or the like.

[Step 2]

After step 1 is completed, a plasma-excited $O_2$ gas is supplied to the wafers 200 accommodated within the process chamber 201.

At this step, the opening/closing control of the valves 243b to 243d is executed by a procedure similar to the procedure of the opening/closing control of the valves 243a, 243c and 243d executed at step 1. The flow rate of the $O_2$ gas is adjusted by the MFC 241b. The $O_2$ gas is supplied to the buffer chamber 237 via the nozzle 249b. At this time, high-frequency power is supplied to between the rod-shaped electrodes 269 and 270. The $O_2$ gas supplied into the buffer chamber 237 is plasma-excited. The $O_2$ gas is supplied into the process chamber 201 as active species and is exhausted from the exhaust pipe 231. At this time, the plasma-activated (excited) $O_2$ gas is supplied to the wafers 200.

The supply flow rate of the $O_2$ gas controlled by the MFC 241b is set to fall within a range of, for example, 100 to 10,000 sccm. The high-frequency power applied to between the rod-shaped electrodes 269 and 270 is set to fall within a range of, for example, 50 to 1,000 W. The internal pressure of the process chamber 201 is set to fall within a range of, for example, 1 to 100 Pa. The partial pressure of the $O_2$ gas within the process chamber 201 is set to fall within a range of, for example, 0.01 to 100 Pa. The use of plasma makes it possible to activate the $O_2$ gas even when the internal pressure of the process chamber 201 is set to fall within the relatively low pressure zone. The time period during which the active species obtained by plasma-exciting the $O_2$ gas is supplied to the wafers 200, namely the gas supply time (irradiation time), is set to fall within a range of, for example, 1 to 100 seconds, specifically 1 to 50 seconds. Other processing conditions are similar to the processing conditions of step 1 described above.

By supplying the $O_2$ gas to the wafers 200 under the aforementioned conditions, the Si-containing layer formed on the wafer 200 is plasma-oxidized. At this time, the Si—N bond and the Si—H bond of the Si-containing layer are broken by the energy of the plasma-excited $O_2$ gas. N and H separated from Si, and C bonded to N, are desorbed from the Si-containing layer. Then, Si in the Si-containing layer, which has dangling bonds as a result of desorption of N and the like, is bonded to O contained in the $O_2$ gas, thereby forming Si—O bonds. By virtue of this reaction, the Si-containing layer is changed (modified) to a layer including Si and O, namely a silicon oxide layer (SiO layer).

In order to modify the Si-containing layer to the SiO layer, it is necessary to supply the $O_2$ gas by plasma-exciting the same. The reason is follows. Even if the $O_2$ gas is supplied under a non-plasma atmosphere, the energy required in oxidizing the Si-containing layer is deficient in the aforementioned first temperature zone (the temperature zone similar to the temperature zone described at step 1). It is therefore difficult to sufficiently desorb N or C from the Si-containing layer or to sufficiently oxidize the Si-containing layer to increase Si—O bonds.

After the Si-containing layer is changed to the SiO layer, the valve 243b is closed to stop the supply of the $O_2$ gas. Furthermore, the supply of the high-frequency power to between the rod-shaped electrodes 269 and 270. Then, the $O_2$ gas and the reaction byproducts remaining within the process chamber 201 are removed from the interior of the process chamber 201 under the processing procedures and the processing conditions similar to those of step 1. At this time, similar to step 1, the $O_2$ gas and the like remaining within the process chamber 201 may not be completely discharged.

As the oxidant, i.e., the plasma-excited O-containing gas, in addition to the $O_2$ gas, it may be possible to use a nitrous oxide ($N_2O$) gas, a nitrogen monoxide (NO) gas, a nitrogen dioxide ($NO_2$) gas, an ozone ($O_3$) gas, a hydrogen peroxide ($H_2O_2$) gas, a water vapor ($H_2O$ gas), a carbon monoxide (CO) gas, a carbon dioxide ($CO_2$) gas, or the like.

As the inert gas, in addition to the $N_2$ gas, it may be possible to use, for example, various kinds of rare gases illustrated at step 1.

[Performing a Predetermined Number of Times]

A SiO film having a predetermined composition and a predetermined film thickness can be formed by performing, a predetermined number of times (n times), namely once or more, a cycle which non-simultaneously, i.e., non-synchronously, performs steps 1 and 2 described above. The aforementioned cycle may be repeated multiple times. That is to say, the thickness of the SiO layer formed per one cycle may be set smaller than a desired or specified film thickness. The aforementioned cycle may be performed multiple times until the thickness of the SiO film formed by laminating the SiO layer becomes equal to the desired or specified film thickness.

When performing the aforementioned film forming process, there may be a case where a residue including BTBAS (hereinafter referred to as "BTBAS or the like") is attached (adsorbed) to the inner wall of the reaction tube 203, the inner wall of the manifold 209, the surface of the boat 217, the surface of dummy wafers (side dummy wafers) supported by the boat 217, the upper surface of the seal cap 219, the inner wall of the exhaust pipe 231, or the like (hereinafter simply referred to as "the inner wall of the reaction tube 203 or the like"). Furthermore, when performing a film forming process in the next batch processing, there may be a case where BTBAS or the like is desorbed from the inner wall of the reaction tube 203 or the like. BTBAS or the like desorbed from the inner wall of the reaction tube 203 or the like may sometimes affect the deposition rate or the quality of the SiO film when performing the next film forming process, particularly step 2 of supplying the plasma-excited $O_2$ gas.

For example, when repeating the batch processing in which the SiO film is formed by the aforementioned film forming sequence, there may be a case where the deposition rate of the SiO film is increased or the quality of the SiO film is changed under the influence of BTBAS or the like desorbed from the inner wall of the reaction tube 203 or the like. One of main causes of this phenomenon may be that BTBAS or the like desorbed from the inner wall of the reaction tube 203 or the like is mixed with the plasma-excited $O_2$ gas within the process chamber 201, thereby generating a CVD reaction. That is to say, at step 2, there may be a case where BTBAS or the like desorbed from the inner wall of the reaction tube 203 or the like makes a gas phase reaction with the plasma-excited $O_2$ gas supplied into the process chamber 201, whereby a SiO layer (CVD layer) is deposited on the wafer 200. The thickness of the CVD layer is larger than the thickness of the SiO layer which is formed on the wafer 200 without generating a gas phase reaction. Thus, the deposition rate is increased. Furthermore, there may be a case where the particles generated by the gas phase reaction are introduced into the film, consequently reducing the film quality.

Even if a purge process of supplying an inert gas such as a $N_2$ gas or the like into the process chamber 201 and then exhaust the inert gas from the process chamber 201 (hereinafter also referred to as an inert gas purge process or an ordinary purge process) is implemented after performing a film forming process, it is difficult to efficiently remove BTBAS or the like from the inner wall of the reaction tube 203 or the like. For that reason, in the case where the removal of BTBAS or the like is performed by the inert gas purge process, a long period of time is required until the completion of removal of BTBAS or the like. This may lead to a reduction of the substrate processing productivity.

The problem described above becomes particularly conspicuous in a film forming process in which a highly adsorptive gas such as a BTBAS gas or the like is used under a low temperature condition. This problem is a novel problem which has become apparent through the extensive studies conducted by the present inventors.

(Reactive Purge Process)

In the present embodiment, for the purpose of solving the aforementioned problem, a reactive purge process of supplying a plasma-excited $O_2$ gas into the process chamber 201 which has performed the film forming process (hereinafter also referred to as a plasma purge process, an $O_2$* purge process, or an active gas purge process) is performed. This makes it possible to efficiently remove a residue including BTBAS from the inner wall of the reaction tube 203 or the like. It is therefore possible to solve the aforementioned problem.

At this step, a plasma-excited $O_2$ gas is supplied into the process chamber 201 according to the processing procedures similar to those of step 2 of the film forming process. The plasma-excited $O_2$ gas is supplied to the residue including BTBAS, which is adsorbed to the inner wall of the reaction tube 203 or the like. By supplying the plasma-excited $O_2$ gas, the residue including BTBAS, which is adsorbed to the inner wall of the reaction tube 203 or the like, is decomposed and desorbed from the inner wall of the reaction tube 203 or the like. Then, the residue including BTBAS is removed from the interior of the process chamber 201.

The temperature of the heater 207 is set such that the temperature of the wafers 200 (the internal temperature of the process chamber 201) becomes a second temperature equal to or lower than the aforementioned first temperature. For example, when the first temperature is set at 150 degrees C., the second temperature may be set at the same temperature as the first temperature. Furthermore, when the first temperature is set at 150 degrees C., the second temperature may be set at a temperature which falls within a range of a room temperature or more and less than 150 degrees C., for example, a range of from a room temperature to 100 degrees C. By setting the temperature of the heater 207 at this temperature, even when the plasma-excited $O_2$ gas is supplied to the wafer 200, it is possible to maintain the film quality of the SiO film formed on the wafer 200 without changing the film quality. That is to say, it is possible to avoid the reaction of the plasma-excited $O_2$ gas with the SiO film formed on the wafer 200 and to prevent the deterioration of the SiO film formed on the wafer 200.

The time period (purge time) during which the plasma-excited $O_2$ gas is supplied into the process chamber 201 may be set longer than that of step 2 of the film forming process and may be set to fall within a range of, for example, 2 minutes or more and 15 minutes or less, specifically 3 minutes or more and 12 minutes or less, more specifically 5 minutes or more and 10 minutes or less.

If the purge time is less than 2 minutes, there is a possibility that the removal of the residue including BTBAS from the inner wall of the reaction tube 203 or the like becomes insufficient and further that the deposition rate or the film quality of the SiO film formed in the next batch processing is affected. This problem can be solved by setting the purge time at 2 minutes or more. By setting the purge time at 3 minutes or more, it is possible to sufficiently remove the residue including BTBAS and to sufficiently stabilize the deposition rate or the film quality of the SiO film. By setting the purge time at 5 minutes or more, it is possible to reliably achieve these effects.

If the purge time exceeds 15 minutes, there is a possibility that the substrate processing productivity is reduced and further that the gas cost, namely the substrate processing cost, is increased. This problem can be solved by setting the purge time at 15 minutes or less. By setting the purge time at 12 minutes or less, it is possible to sufficiently increase the substrate processing productivity and to sufficiently suppress the increase of the gas cost. By setting the purge time at 10 minutes or less, it is possible to reliably achieve these effects.

Other processing conditions are similar to the processing conditions of step 2 of the film forming process.

As the plasma-exciting gas, in addition to the $O_2$ gas, it may be possible to use various kinds of O-containing gases illustrated at step 2 of the film forming process. Furthermore, as the plasma-exciting gas, in addition to the O-containing gases, it may be possible to use H-containing gases such as a $H_2$ gas, an $NH_3$ gas and the like.

(Atmospheric Pressure Return Step)

After the removal of the residue from the inner wall of the reaction tube 203 or the like is completed, the valve 243b is closed to stop the supply of the $O_2$ gas. Furthermore, the supply of the high-frequency power to between the rod-shaped electrodes 269 and 270 is stopped. Then, the valves 243c and 243d are opened. An $N_2$ gas as the inert gas is supplied from the gas supply pipes 232c and 232d into the process chamber 201 and is exhausted from the exhaust pipe 231. Thus, the interior of the process chamber 201 is purged by the inert gas and the $O_2$ gas or the like remaining within the process chamber 201 is removed from the interior of the process chamber 201 (inert gas purge). Thereafter, the internal atmosphere of the process chamber 201 is substituted with the inert gas (inert gas substitution) and the internal pressure of the process chamber 201 is returned to the atmospheric pressure (atmospheric pressure return).

(Unloading Step)

Thereafter, the seal cap 219 is moved down by the boat elevator 115 and the lower end portion of the manifold 209 is opened. The processed wafers 200, which are supported on the boat 217, are unloaded from the lower end portion of the manifold 209 to the outside of the reaction tube 203 (boat unloading). After unloading the boat 217, the shutter 219s is moved so that the lower end opening of the manifold 209 is sealed by the shutter 219s through the O-ring 220c (shutter closing). The processed wafers 200, which have been unloaded to the outside of the reaction tube 203, are discharged from the boat 217 (wafer discharging). After discharging the wafers 200, an empty boat 217 may be loaded into the process chamber 201.

(3) Effects According to the Present Embodiment

According to the present embodiment, one or more effects may be achieved as follows.

(a) By performing the reactive purge process in which the plasma-excited $O_2$ gas is supplied into the process chamber 201 which has performed the film forming process, it is possible to sufficiently remove the residue including BTBAS from the inner wall of the reaction tube 203 or the like. This makes it possible to avoid the reduction of the deposition rate or the change of the film quality when repeatedly performing the batch processing. That is to say, even when an easy-to-remain material such as BTBAS or the like is used as the precursor under the low temperature condition, it is possible to stabilize the deposition rate or the film quality.

(b) The purge process performed after the film forming process is implemented using the plasma-excited $O_2$ gas. Therefore, as compared with a case where the purge process is implemented using an inert gas such as a $N_2$ gas or the like, it is possible to efficiently remove the residue including BTBAS from the inner wall of the reaction tube 203 or the like. It is also possible to significantly shorten the time (purge time) required in removing the residue. As a result, it is possible to increase the number of times of the batch processing which can be performed per unit time, namely the number of the wafers 200 which can be processed per unit time. This makes it possible to improve the substrate processing productivity.

(c) By performing the film forming process at the first temperature at which the BTBAS gas or the $O_2$ gas is not pyrolyzed, it is possible to reduce the amount of heat applied to the wafers 200 and to satisfactorily execute the control of a thermal history of the wafers 200.

(d) By performing the reactive purge process at the second temperature equal to or lower than the first temperature, it is possible to reduce the amount of heat applied to the wafers 200 when performing the reactive purge process and to satisfactorily execute the control of a thermal history of the wafers 200. Furthermore, it is possible to maintain the film quality of the SiO film formed on the wafer 200 without changing the film quality.

(e) The respective effects mentioned above can be similarly achieved even if a gas other than the BTBAS gas is used as the precursor when performing the film forming process or even if a gas other than the $O_2$ gas is plasma-excited and used as the reactant. Furthermore, the respective effects mentioned above can be similarly achieved even if a gas other than the $O_2$ gas is plasma-excited and used as the plasma-excited gas when performing the reactive purge process.

(4) Modifications

The film forming sequence according to the present embodiment is not limited to the form illustrated in FIG. 4 and may be modified as in the modifications to be described below.

(Modification 1)

In the film forming process, it may be possible to further perform a step of supplying a pyridine gas as a catalyst to the wafer 200. For example, as illustrated in FIG. 5A, a SiO film may be formed on the wafer 200 by performing, a predetermined number of times (once or more), a cycle which non-simultaneously performs a step of supplying a HCDS gas and a pyridine gas to the wafer 200, and a step of supplying a $H_2O$ gas and a pyridine gas to the wafer 200. At the step of supplying the HCDS gas and the pyridine gas to the wafer 200, for example, the HCDS gas is supplied from the gas supply pipe 232a and the pyridine gas is supplied from the gas supply pipe 232b. Furthermore, at the step of supplying the $H_2O$ gas and the pyridine gas to the wafer 200, for example, the $H_2O$ gas is supplied from the gas supply pipe 232b and the pyridine gas is supplied from the gas supply pipe 232a. For the sake of convenience, the film forming sequence of the present modification may sometimes be indicated as follows.

(HCDS+pyridine→$H_2O$+pyridine)×$n$ ⇒ SiO

If the film forming process illustrated in FIG. 5A is performed, there may be a case where a residue including moisture ($H_2O$) is attached (absorbed) to the inner wall of the reaction tube 203 or the like. Furthermore, when the film forming process of the next batch processing is performed, there may be a case where moisture or a residue including moisture (hereinafter generally and simply referred to as "moisture") is desorbed from the inner wall of the reaction tube 203 or the like. The moisture desorbed from the inner wall of the reaction tube 203 or the like when performing the next film forming process, particularly the step of supplying the HCDS gas and the pyridine gas may affect the deposition rate or the film quality of the SiO film.

For example, when repeating the batch processing in which the SiO film is formed by the film forming sequence illustrated in FIG. 5A, there may be a case where the deposition rate of the SiO film is increased or the film quality of the SiO film is changed under the influence of the moisture desorbed from the inner wall of the reaction tube 203 or the like. One of main causes of this phenomenon may be that the moisture desorbed from the inner wall of the reaction tube 203 or the like is mixed with the HCDS gas supplied into the process chamber 201 at step 1, thereby generating a CVD reaction. As described above, the CVD reaction generated within process chamber 201 may increase the deposition rate or reduce the film quality.

Even if an inert gas purge process of supplying an inert gas such as a N2 gas or the like into the process chamber 201 is implemented after performing the film forming process, it is difficult to efficiently remove he moisture from the inner wall of the reaction tube 203 or the like. For that reason, in the case where the removal of the moisture is performed by the inert gas purge process, a long period of time is required until the completion of removal of the moisture. This may lead to a reduction of the substrate processing productivity.

The problem described above becomes particularly conspicuous in a film forming process in which a gas including an OH group, such as a $H_2O$ gas or the like, is used under a low temperature condition. This problem is a novel problem which has become apparent through the extensive studies conducted by the present inventors.

In the present modification, for the purpose of solving the aforementioned problem, a reactive purge process of supplying an alcohol, for example, a IPA, into the process chamber 201 which has performed the film forming process, via the gas supply pipe 232b, the MFC 241b, the valve 243b, the nozzle 249b and the buffer chamber 237 (hereinafter also referred to as an alcohol gas purge process) is performed. This makes it possible to efficiently remove the moisture from the inner wall of the reaction tube 203 or the like. It is therefore possible to solve the aforementioned problem. The IPA may be supplied into the process chamber 201 via the gas supply pipe 232a, the MFC 241a, the valve 243a and the nozzle 249a.

(Modification 2)

Figure 5B:
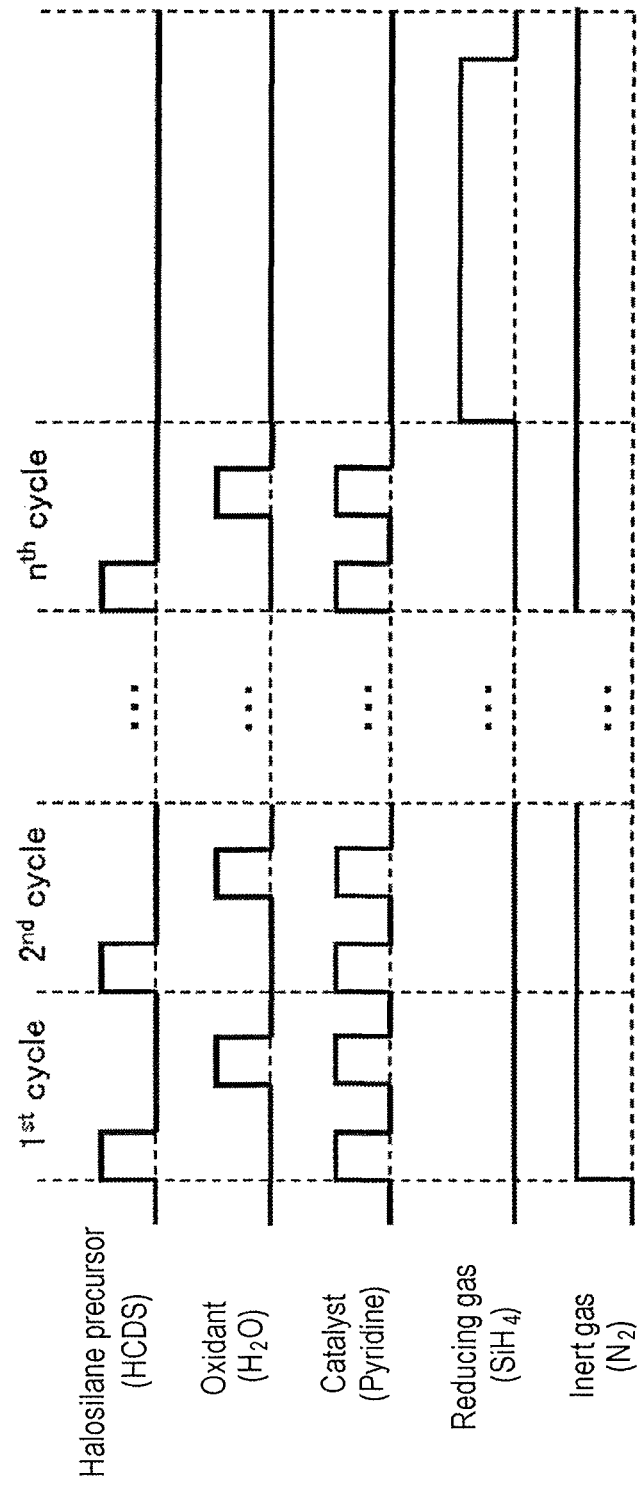
FIG. 5B is a view illustrating another modification of the substrate processing sequence according to one embodiment of the present disclosure.

As illustrated in FIG. 5B, after the film forming process of forming the SiO film on the wafer 200 is performed according to the processing procedures similar to that of the film forming process of modification 1, it may be possible to perform a reactive purge process in which a reducing agent, for example, a $SiH_4$ gas, is supplied into the process chamber 201 via the gas supply pipe 232b, the MFC 241b, the valve 243b, the nozzle 249b and the buffer chamber 237 (hereinafter also referred to as a silane purge process or a reducing agent purge process). Even in the present modification, it is possible to efficiently remove the moisture from the inner wall of the reaction tube 203 or the like and to achieve the effects similar to those of modification 1. The $SiH_4$ gas may be supplied into the process chamber 201 via the gas supply pipe 232a, the MFC 241a, the valve 243a and the nozzle 249a.

(Modification 3)

As illustrated in FIG. 5C, after the film forming process of forming the SiO film on the wafer 200 is performed according to the processing procedures similar to that of the film forming process of modification 1, it may be possible to perform a reactive purge process in which a plasma-excited gas, for example, a plasma-excited $H_2$ gas, is supplied into the process chamber 201 via the gas supply pipe 232b, the MFC 241b, the valve 243b, the nozzle 249b and the buffer chamber 237 (hereinafter also referred to as a plasma purge process or an active gas purge process). Even in the present modification, it is possible to efficiently remove $H_2O$ from the inner wall of the reaction tube 203 or the like and to achieve the effects similar to those of modification 1. The H-containing gas such as a $H_2$ gas or the like is one kind of reducing agent. This process may be regarded as one kind of purge process.

(Modification 4)

The substrate processing sequence illustrated in FIG. 4 and the respective substrate processing sequences illustrated in FIGS. 5A to 5C may be performed in arbitrary combinations. That is to say, after performing the film forming process illustrated in FIG. 4 and FIGS. 5A to 5C, the reactive purge process illustrated in FIG. 4 and the reactive purge processes illustrated in FIG. 5A, FIGS. 5B and 5C may be performed in arbitrary combinations.

For example, the reactive purge process may be performed by sequentially supplying in an arbitrary order or simultaneously supplying in an arbitrary combination, a plurality of substances selected from a group consisting of a plasma-excited gas, an alcohol, and a reducing agent, into the process chamber 201 which has performed the film forming process illustrated in FIG. 4 and FIGS. 5A to 5C. For example, the plasma purge process may be performed after performing the alcohol purge process. The plasma purge process may be performed after performing the reducing agent purge process. The $O_2$ plasma purge process and the $H_2$ plasma purge process may be performed sequentially or simultaneously. In addition, the reactive purge process may be performed by combining these supply procedures.

Moreover, for example, the reactive purge process may be performed by sequentially supplying in an arbitrary order or simultaneously supplying in combination, a $SiH_4$ gas and a plasma-excited $H_2$ gas, into the process chamber 201 which has performed the film forming process illustrated in FIG. 4 and FIGS. 5A to 5C, or by combining these supply procedures. That is to say, the reactive purge process may be performed by sequentially supplying in an arbitrary order or simultaneously supplying in an arbitrary combination, plural kinds of reducing agents. In addition, the reactive purge process may be performed by combining these supply procedures.

(Modification 5)

The internal pressure of the process chamber 201 may be changed when performing the reactive purge process illustrated in FIG. 4 and FIGS. 5A to 5C.

For example, when performing the reactive purge process, a plasma-excited $O_2$ gas or the like may be intermittently supplied into the process chamber 201 while evacuating the interior of the process chamber 201. Furthermore, for example, when performing the reactive purge process, the evacuation of the interior of the process chamber 201 and the supply of the plasma-excited $O_2$ gas or the like into the process chamber 201 may be alternately repeated.

That is to say, when performing the reactive purge process, the interior of the process chamber 201 may be cyclically purged using at least one selected from a group consisting of a plasma-excited gas, an alcohol, and a reducing agent. This makes it possible to further efficiently remove the residue including BTBAS or moisture from the inner wall of the reaction tube 203 or the like. Particularly, in the case of performing the alcohol purge process, a process of enabling an alcohol and moisture to have an affinity for each other by increasing the internal pressure of the process chamber 201 during the supply of the alcohol and by casing the alcohol to be adsorbed to the residue including moisture and a process of vaporizing an alcohol and moisture by evacuating the interior of the process chamber 201 in one breath may be alternately preformed a predetermined number of times, specifically multiple times. This makes it possible to further enhance the removal efficiency of the residue including moisture.

(Processing Condition of Film Forming Process)

In the respective modifications described above, at the step of supplying the HCDS gas and the pyridine gas to the wafer 200, the internal pressure of the process chamber 201 is set to fall within a range of for example, 1 to 3,000 Pa, specifically 133 to 2,666 Pa. The supply flow rate of the HCDS gas controlled by the MFC 241a is set to fall within a range of, for example, 1 to 2,000 sccm, specifically 10 to 1,000 sccm. The supply flow rate of the pyridine gas controlled by the MFC 241b is set to fall within a range of, for example, 1 to 2,000 sccm, specifically 10 to 1,000 sccm. The supply flow rate of the $N_2$ gas controlled by the MFCs 241c and 241d is set to fall within a range of, for example, 100 to 10,000 sccm. The time period during which the HCDS gas and the pyridine gas are supplied to the wafer 200, namely the gas supply time (irradiation time), is set to fall within a range of, for example, 1 to 100 seconds, specifically 1 to 50 seconds, as in the aforementioned embodiment. Similar to the aforementioned embodiment, the temperature of the heater 207 is set such that the temperature of the wafers 200 becomes a temperature (first temperature) which falls within a range of, for example, 0 degrees C. or more and 150 degrees C. or less, specifically a room temperature (25 degrees C.) or more and 100 degrees C. or less, more specifically 40 degrees C. or more and 90 degrees C. or less.

In the respective modifications described above, at the step of supplying the $H_2O$ gas and the pyridine gas to the wafer 200, the supply flow rate of the $H_2O$ gas controlled by the MFC 241b is set to fall within a range of, for example, 10 to 10,000 sccm, specifically 100 to 1,000 sccm. The supply flow rate of the pyridine gas controlled by the MFC 241a is set to fall within a range of, for example, 1 to 2,000 sccm, specifically 10 to 1,000 sccm. The time period during which the $H_2O$ gas and the pyridine gas are supplied to the wafer 200, namely the gas supply time (irradiation time), is set to fall within a range of, for example, 1 to 100 seconds, specifically 1 to 50 seconds. Other processing conditions are similar to, for example, the processing conditions of the step of supplying the HCDS gas and the pyridine gas.

As the precursor gas, in addition to the HCDS gas, it may be possible to use an inorganic halosilane precursor gas such as an OCTS gas, a dichlorosilane ($SiH_2Cl_2$, abbreviation: DCS) gas, a monochlorosilane ($SiH_3Cl$, abbreviation: MCS) gas, a tetrachlorosilane, i.e., silicon tetrachloride ($SiCl_4$, abbreviation: STC) gas, a trichlorosilane ($SiHCl_3$, abbreviation: TCS) gas or the like. Furthermore, as the precursor gas, it may be possible to use an organic halosilane precursor gas such as a BTCSE gas, a BTCSM gas, a TCDMDS gas, a DCTMDS gas, a MCPMDS gas or the like. In the case where the organic halosilane precursor gas having a Si—C bond and acting as a C source is used as the precursor gas, it is possible to form a SiO film including C, namely a silicon oxycarbide film (SiOC film), on the wafer 200.

As the oxidant, in addition to the $H_2O$ gas, it may be possible to use, for example, various kinds of O-containing gases illustrated at step 2 of the film forming process illustrated in FIG. 4.

As the catalyst gas, in addition to the pyridine gas, it may be possible to use, for example, a cyclic amine-based gas such as an aminopyridine gas, a picoline gas, a lutidine gas, a piperazine gas, a piperidine gas or the like, a chain amine-based gas such as a TEA gas, a DEA gas, an MEA gas, a TMA gas, an MMA gas or the like, or a non-amine-based gas such as a $NH_3$ gas or the like.

As the inert gas, in addition to the $N_2$ gas, it may be possible to use, for example, various kinds of rare gases described above.

(Processing Condition of Reactive Purge Process)

In modification 1 or the like described above, at the step of supplying the IPA into the process chamber 201, the supply flow rate of the IPA controlled by the MFC 241b is set to fall within a range of, for example, 10 to 10,000 sccm, specifically 100 to 1,000 sccm. The temperature of the heater 207 is set such that the temperature of the wafers 200 (the internal temperature of the process chamber 201) becomes a second temperature equal to or lower than the first temperature. Other processing conditions are similar to the processing conditions of the reactive purge process of the substrate processing sequence illustrated in FIG. 4. As the alcohol, in addition to the IPA, it may be possible to use ethanol ($CH_3CH_2OH$), methanol ($CH_3OH$) or the like. That is to say, it may be possible to use a substance having a hydroxy group, which is represented by a chemical formula of R—OH (R: $CH_3$, $C_2H_5$, $C_3H_7$, or the like).

In modification 2 or the like described above, at the step of supplying the $SiH_4$ gas into the process chamber 201, the supply flow rate of the $SiH_4$ gas controlled by the MFC 241b is set to fall within a range of, for example, 10 to 10,000 sccm, specifically 100 to 1,000 sccm. The temperature of the heater 207 is set such that the temperature of the wafers 200 (the internal temperature of the process chamber 201) becomes a second temperature equal to or lower than the first temperature. Other processing conditions are similar to the processing conditions of the reactive purge process of the substrate processing sequence illustrated in FIG. 4. As the reducing agent, in addition to the $SiH_4$ gas, it may be possible to use various kinds of silicon hydride such as a disilane ($Si_2H_6$, abbreviation: DS) gas, a trisilane ($Si_3H_8$, abbreviation: TS) gas or the like.

In modification 3 or the like described above, at the step of supplying the plasma-excited $H_2$ gas into the process chamber 201, the supply flow rate of the $H_2$ gas controlled by the MFC 241b is set to fall within a range of, for example, 100 to 10,000 sccm. The temperature of the heater 207 is set such that the temperature of the wafers 200 (the internal temperature of the process chamber 201) becomes a second temperature equal to or lower than the first temperature. Other processing conditions are similar to the processing conditions of the reactive purge process of the substrate processing sequence illustrated in FIG. 4. As the plasma-excited gas, in addition to the $H_2$ gas, it may be possible to use H-containing gases such as a $NH_3$ gas and the like.

OTHER EMBODIMENTS OF THE PRESENT DISCLOSURE

While one embodiment of the present disclosure has been specifically described above, the present disclosure is not limited to the aforementioned embodiment but may be differently modified without departing from the spirit of the present disclosure.

For example, in the aforementioned embodiment, there has been described an example where the reactive purge process is performed only in a state in which the wafers 200 exist within the process chamber 201. However, the present disclosure is not limited to this form. That is to say, the reactive purge process may be performed only in a state in which the wafers 200 do not exist within the process chamber 201. Furthermore, the reactive purge process may be performed both in a state in which the wafers 200 exist within the process chamber 201 and in a state in which the wafers 200 do not exist within the process chamber 201. If the reactive purge process is performed in a state in which the wafers 200 do not exist within the process chamber 201, namely in a state in which the wafers 200 subjected to the film forming process are unloaded from the interior of the process chamber 201, it becomes easier to maintain the film quality of the film formed on the wafer 200.

When performing the reactive purge process in a state in which the wafers 200 do not exist within the process chamber 201, the reactive purge process is performed in a state in which the lower end opening of the manifold 209 is sealed by the shutter 219s after carrying out the boat unloading, or in a state in which an empty boat 217 is loaded into the process chamber 201. The processing procedures and processing conditions of the reactive purge process may be similar to the processing procedures and processing conditions of the reactive purge process of the embodiment or each of the modifications described above. After the reactive purge process is performed in a state in which the wafers 200 do not exist within the process chamber 201, the interior of the process chamber 201 may be purged with an inert gas such as a $N_2$ gas or the like. In the case where the reactive purge process is performed in a state in which the wafers 200 do not exist within the process chamber 201, the internal temperature of the process chamber 201 may be set at a temperature higher than the aforementioned second temperature, for example, a temperature higher than the aforementioned first temperature (e.g., a temperature which falls within a range of 150 to 300 degrees C.). In this case, it is possible to effectively remove the residue from the inner wall of the reaction tube 203 or the like. Furthermore, in the case where the reactive purge process is performed in a state in which the lower end opening of the manifold 209 is sealed by the shutter 219s after carrying out the boat unloading (in a state in which the wafers 200 do not exist within the process chamber 201), it may be possible to perform the reactive purge process in parallel with the wafer discharging process or the wafer charging process of the next batch processing. This makes it possible to sufficiently secure the time for the reactive purge process without affecting the substrate processing productivity. In addition, it is possible to sufficiently remove the residue including BTBAS or moisture from the interior of the process chamber 201.

For example, in the aforementioned embodiment, there has been described an example where the reactant is supplied after supplying the precursor. The present disclosure is not limited to this form. The supply order of the precursor and the reactant may be reversed. That is to say, the precursor may be supplied after supplying the reactant. By changing the supply order, it becomes possible to change the quality and composition ratio of the film as formed.

Furthermore, in the aforementioned modifications, there has been described an example where a chlorosilane precursor gas is used as the precursor gas. The present disclosure is not limited to this form. A halosilane precursor gas other than the chlorosilane precursor gas, for example, a fluorosilane precursor gas or a bromosilane precursor gas, may be used as the precursor gas. At this time, the processing conditions may be similar to, for example, the processing conditions of the aforementioned modifications.

If the silicon-based insulation film formed by the method of the aforementioned embodiment is used as a sidewall spacer, it is possible to provide a technique of forming a device which is small in leak current and superior in workability. Furthermore, if the aforementioned silicon-based insulation film is used as an etching stopper, it is possible to provide a technique of forming a device which is superior in workability. Furthermore, in some of the modifications, it is possible to form the silicon-based insulation film without having to use plasma. This makes it possible to adapt the present disclosure to a process for forming, e.g., a SADP film of a DPT, in which plasma damage is about a concern.

In the aforementioned embodiment, there has been described an example where the SiO film is formed on the wafer 200. The present disclosure is not limited to this form but may be suitably applied to a case where a Si-based oxide film such as a silicon oxycarbide film (SiOC film), a silicon oxycarbonitride film (SiOCN film), a silicon oxynitride film (SiON film) or the like is formed on the wafer 200. For example, the present disclosure may be suitably applied to a case where a SiOC film is formed on the wafer 200 according to the film forming sequence too be described below. At this time, the processing conditions may be similar to, for example, the processing conditions of the modifications described above.

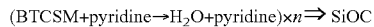
(BTCSM+pyridine→H₂O+pyridine)×n ⇒ SiOC

The present disclosure may be suitably applied to a case where an oxide film containing a metal element such as titanium (Ti), zirconium (Zr), hafnium (Hf), tantalum (Ta), niobium (Nb), aluminum (Al), molybdenum (Mo), tungsten (W) or the like, namely a metal-based oxide film, is formed on the wafer 200. That is to say, the present disclosure may be suitably applied to a case where a TiO film, a TiOC film, a TiOCN film, a TiON film, a ZrO film, a ZrOC film, a ZrOCN film, a ZrON film, a HfO film, a HfOC film, a HfOCN film, a HfON film, a TaO film, a TaOC film, a TaOCN film, a TaON film, a NbO film, a NbOC film, a NbOCN film, a NbON film, an AlO film, an AlOC film, an AlOCN film, an AlON film, a MoO film, a MoOC film, a MoOCN film, a MoON film, a WO film, a WOC film, a WOCN film or a WON film is formed on the wafer 200.

For example, the present disclosure may be suitably applied to a case where a tetrakis(dimethylamino)titanium (Ti[N(CH₃)₂]₄, abbreviation: TDMAT) gas, a tetrakis(ethyl-methyl-amino)hafnium (Hf[N(C₂H₅)(CH₃)]₄, abbreviation: TEMAH) gas, a tetrakis(ethyl-methyl-amino)zirconium (Zr[N(C₂H₅)(CH₃)]₄, abbreviation: TEMAZ) gas, a trimethyl aluminum (Al(CH₃)₃, abbreviation: TMA) gas, a titanium tetrachloride (TiCl₄) gas, a hafnium tetrachloride (HfCl₄) gas or the like is used as the precursor gas and where a titanium oxide film (TiO film), a hafnium oxide film (HfO film), a zirconium oxide film (ZrO film), an aluminum oxide film (AlO film) or the like is formed on the wafer 200 according to the film forming sequences illustrated below.

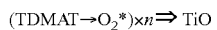
(TDMAT→O₂*)×n ⇒ TiO

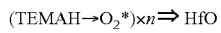
(TEMAH→O₂*)×n ⇒ HfO

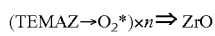
(TEMAZ→O₂*)×n ⇒ ZrO

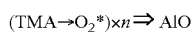
(TMA→O₂*)×n ⇒ AlO

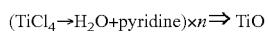
(TiCl₄→H₂O+pyridine)×n ⇒ TiO

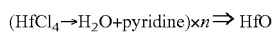
(HfCl₄→H₂O+pyridine)×n ⇒ HfO

That is to say, the present disclosure may be suitably supplied to a case where a reactive purge process is performed with respect to the interior of the process chamber 201 which has performed the process of forming a semiconductor-based film or a metal-based film. The processing procedures and processing conditions of this film forming process may be similar to the processing procedures and processing conditions of the film forming process illustrated in the embodiment and the modifications described above. Furthermore, the processing procedures and processing conditions of the reactive purge process performed after the film forming process may be similar to the processing procedures and processing conditions of the reactive purge process illustrated in the embodiment and the modifications described above. Even in these cases, it is possible to achieve the effects similar to those of the embodiment and the modifications described above.

Recipes (programs in which the processing procedures and processing conditions are written) used in the film forming process and the reactive purge process may be prepared individually according to the processing contents (the kind, composition ratio, quality and film thickness of the thin film as formed, the kind and quantity of the residual material, the processing procedures, the processing conditions, etc.) and may be stored in the memory device 121c via a telecommunication line or the external memory device 123. Moreover, at the start of various kinds of processes, the CPU 121a may properly select an appropriate recipe from the recipes stored in the memory device 121c according to the processing contents. This enables a single substrate processing apparatus to form thin films of different kinds, composition ratios, film qualities and thicknesses for general purposes and with enhanced reproducibility. Furthermore, it is possible to efficiently and reliably remove various kinds of residues from the inner wall of the reaction tube 203 or the like. In addition, it is possible to reduce an operator's burden (a burden borne by an operator when inputting the processing procedures and the processing conditions) and to quickly start various kinds of processes while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example where films are formed using a batch type substrate processing apparatus capable of processing a plurality of substrates at a time. The present disclosure is not limited to the aforementioned embodiment but may be suitably applied to, for example, a case where films are formed using a single-substrate-type substrate processing apparatus capable of processing a single substrate or several substrates at a time. In addition, in the aforementioned embodiment, there has been described an example where films are formed using a substrate processing apparatus provided with a hot-wall-type processing furnace. The present disclosure is not limited to the aforementioned embodiment but may be suitably applied to a case where films are formed using a substrate processing apparatus provided with a cold-wall-type processing furnace. Even in these cases, the processing procedures and processing conditions may be similar to, for example, the processing procedures and processing conditions of the aforementioned embodiment.

Figure 14:
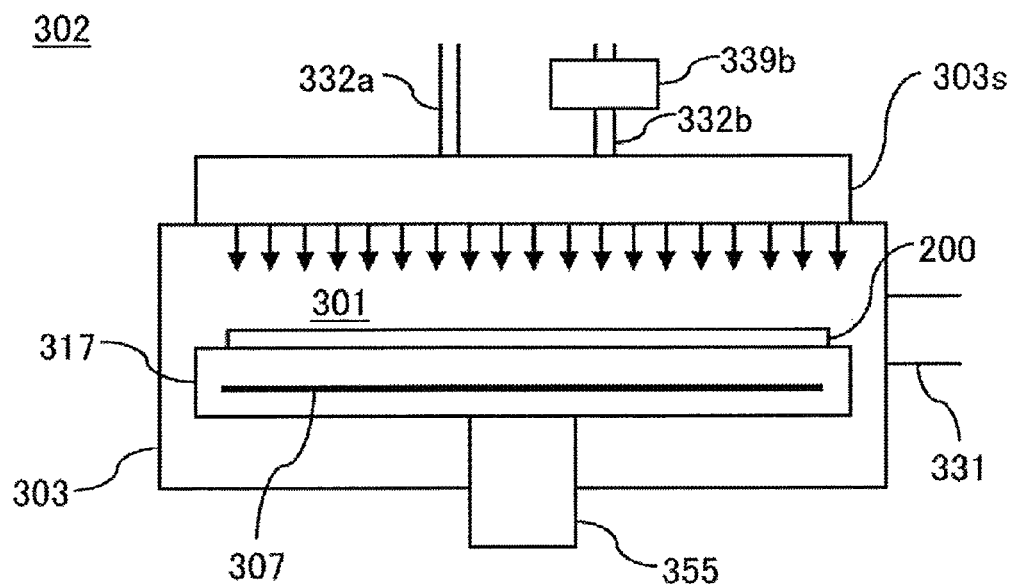
FIG. 14 is a schematic configuration view of a processing furnace of a substrate processing apparatus suitably used in another embodiment of the present disclosure, in which a portion of the processing furnace is shown in a vertical cross section.

The present disclosure may be suitably applied to, for example, a case where a film is formed using a substrate processing apparatus provided with a processing furnace 302 illustrated in FIG. 14. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a and 332b are connected to inlets (gas introduction holes) of the shower head 303s. A gas supply system identical with the first gas supply system of the aforementioned embodiment is connected to the gas supply port 332a. A remote plasma unit (or a plasma generating device) 339b as an exciting part configured to supply a gas by plasma-exciting the same and a supply system identical with the second supply system and the third supply system of the aforementioned embodiment are connected to the gas supply port 332b. A gas distribution plate configured to supply a gas into the process chamber 301 in a shower-like manner is installed in outlets (gas discharge holes) of the shower head 303s. The shower head 303s is installed in such a position as to face the surfaces of the wafers 200 loaded into the process chamber 301. An exhaust port 331 configured to evacuate the interior of the process chamber 301 is installed in the process vessel 303. An exhaust system identical with the exhaust system of the aforementioned embodiment is connected to the exhaust port 331.

Figure 15:
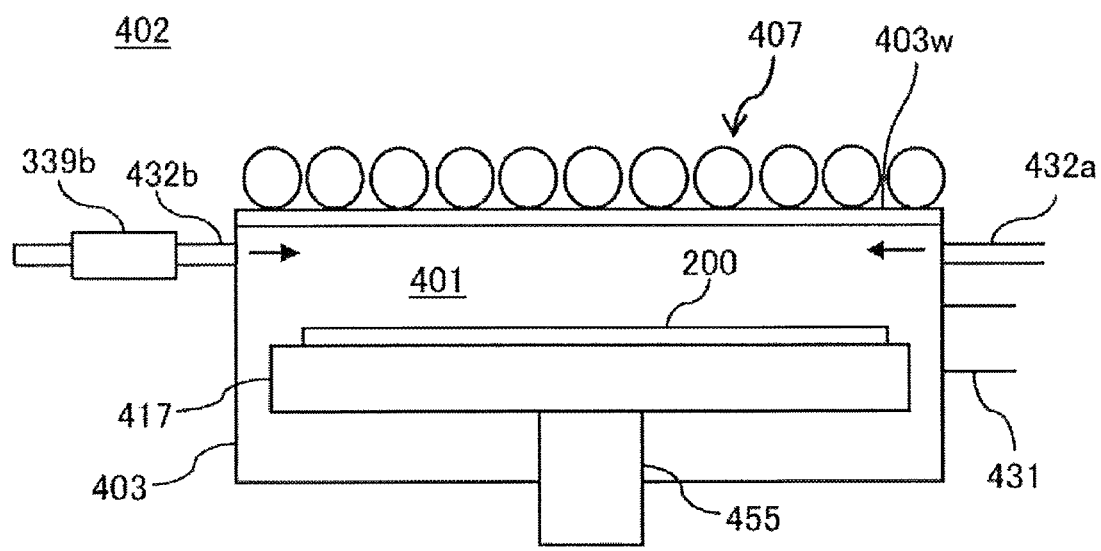
FIG. 15 is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, for example, a case where a film is formed using a substrate processing apparatus provided with a processing furnace 402 illustrated in FIG. 15. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 accommodated within the process vessel 403, and a quartz window 403w which transmits the light irradiated from the lamp heater 407. Gas supply ports 432a and 432b are connected to the process vessel 403. A supply system identical with the first supply system of the aforementioned embodiment is connected to the gas supply port 432a. The aforementioned remote plasma unit 339b and the supply system identical with the second supply system and the third supply system of the aforementioned embodiment are connected to the gas supply port 432b. The gas supply ports 432a and 432b are respectively installed at the lateral side of the end portions of the wafers 200 loaded into the process chamber 401, namely in such positions as not to face the surfaces of the wafers 200 loaded into the process chamber 401. An exhaust port 431 configured to evacuate the interior of the process chamber 401 is installed in the process vessel 403. An exhaust system identical with the exhaust system of the aforementioned embodiment is connected to the exhaust port 431.

Even in the case of using these substrate processing apparatuses, a film forming process or a reactive purge process can be performed according to the sequences and processing conditions similar to those of the embodiments and modifications described above. It is also possible to achieve the effects similar to those of the embodiments and modifications described above.

The embodiments and modifications described above may be appropriately combined with one another. In addition, the processing conditions used at this time may be similar to, for example, the processing conditions of the embodiments described above.

Example

Next, descriptions will be made on the experimental results that support the effects achieved in the embodiments and modifications described above.

(Removal Efficiency of Residue)

As a first evaluation, a process of forming a SiO film on a plurality of wafers was performed using the substrate processing apparatus of the aforementioned embodiment according to the film forming sequence illustrated in FIG. 4. A BTBAS gas was used as a precursor. A plasma-excited $O_2$ gas was used as a reactant. The processing conditions of the film forming process were set to fall within a range of the processing conditions described in the aforementioned embodiment. Mass spectrometry using a residual gas analyzer (RGA) was conducted with respect to the amount of a residue which remains within the process chamber immediately after performing the film forming process, namely before performing the purge process.

As a second evaluation, a process of forming a SiO film on a plurality of wafers was performed using the substrate processing apparatus of the aforementioned embodiment according to the processing procedures and processing conditions similar to those of the first evaluation. Thereafter, a purge process (ordinary purge process) of intermittently supplying a $N_2$ gas into the process chamber while evacuating the interior of the process chamber was performed for 20 minutes. This process may be referred to as a normal cycle purge process. The supply flow rate of the $N_2$ gas was set equal to the supply flow rate of an $O_2$ gas used in a reactive purge process of a third evaluation which will be described later. Other processing conditions were similar to the processing conditions used in a reactive purge process of a third evaluation which will be described later. Then, mass spectrometry using a RGA was conducted with respect to the amount of a residue which remains within the process chamber immediately after performing the ordinary purge process.

As a third evaluation, a process of forming a SiO film on a plurality of wafers was performed using the substrate processing apparatus of the aforementioned embodiment according to the processing procedures and processing conditions similar to those of the first evaluation. Thereafter, a reactive purge process (plasma purge process) of intermittently supplying a plasma-excited $O_2$ gas into the process chamber while evacuating the interior of the process chamber was performed for 5 minutes. That is to say, the supply of the plasma-excited $O_2$ gas into the process chamber and the evacuation of the interior of the process chamber were alternately and repeatedly performed. This process may be referred to as a plasma cycle purge process. The processing conditions of the plasma purge process were set to fall within a range of the processing conditions described in the aforementioned embodiment. Then, mass spectrometry using a RGA was conducted with respect to the amount of a residue which remains within the process chamber immediately after performing the plasma purge process.

Figure 11:
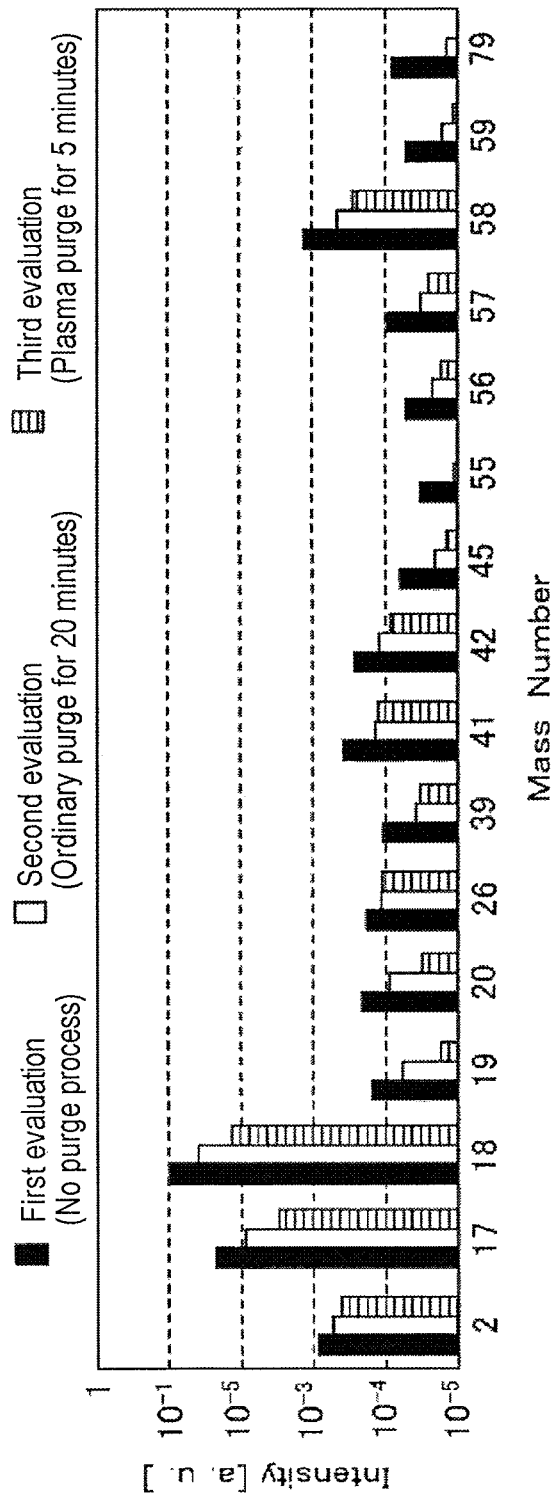
FIG. 11 is a view showing evaluation results on the amount of a residue remaining within a process chamber after a film forming process.

FIG. 11 is a view showing the evaluation results on the amount of the residue remaining within the process chamber after the film forming process. The horizontal axis in FIG. 11 indicates the mass number of the residue. The vertical axis in FIG. 11 indicates the detection intensity of the residue in an arbitrary unit. A BTBAS component is included in the residue. In FIG. 11, black, white and shaded bars indicate the evaluation results of the first to third evaluations, respectively. According to FIG. 11, it can be noted that, by performing the ordinary purge process or the plasma purge process, it is possible to reduce the amount of the residue including BTBAS within the process chamber. Furthermore, it can be appreciated that the amount of the residue including BTBAS becomes smaller when performing the plasma purge process for 5 minutes than when performing the ordinary purge process for 20 minutes. That is to say, it can be seen that the removal efficiency of the residue including BTBAS becomes higher in the plasma purge process than in the ordinary purge process.

(Productivity and Deposition Rate)

As a fourth evaluation, a process of forming a SiO film on a plurality of wafers was performed multiple times using the substrate processing apparatus of the aforementioned embodiment according to the film forming sequence illustrated in FIG. 4. A BTBAS gas was used as a precursor. A plasma-excited $O_2$ gas was used as a reactant. The processing conditions of the film forming process were set to fall within a range of the processing conditions described in the aforementioned embodiment. Furthermore, each time when the film forming process is performed, an ordinary purge process was performed according to the procedures similar to those of the second evaluation described above. The processing conditions of the ordinary purge process were set to become similar to the processing conditions of the second evaluation described above.

As a fifth evaluation, a process of forming a SiO film on a plurality of wafers was performed multiple times using the substrate processing apparatus of the aforementioned embodiment according to the processing procedures and processing conditions similar to those of the fourth evaluation. Each time when the film forming process is performed, a plasma purge process was performed according to the procedures similar to those of the third evaluation described above. The processing conditions of the plasma purge process were set to become similar to the processing conditions of the third evaluation described above (fifth evaluation).

In each of the fourth and fifth evaluations, the number of wafers that can be processed per unit time (WPH), namely the substrate processing productivity, was evaluated. Furthermore, in each of the fourth and fifth evaluations, the stability of the deposition rate was evaluated with respect to the SiO film formed on the wafer.

Figure 12:
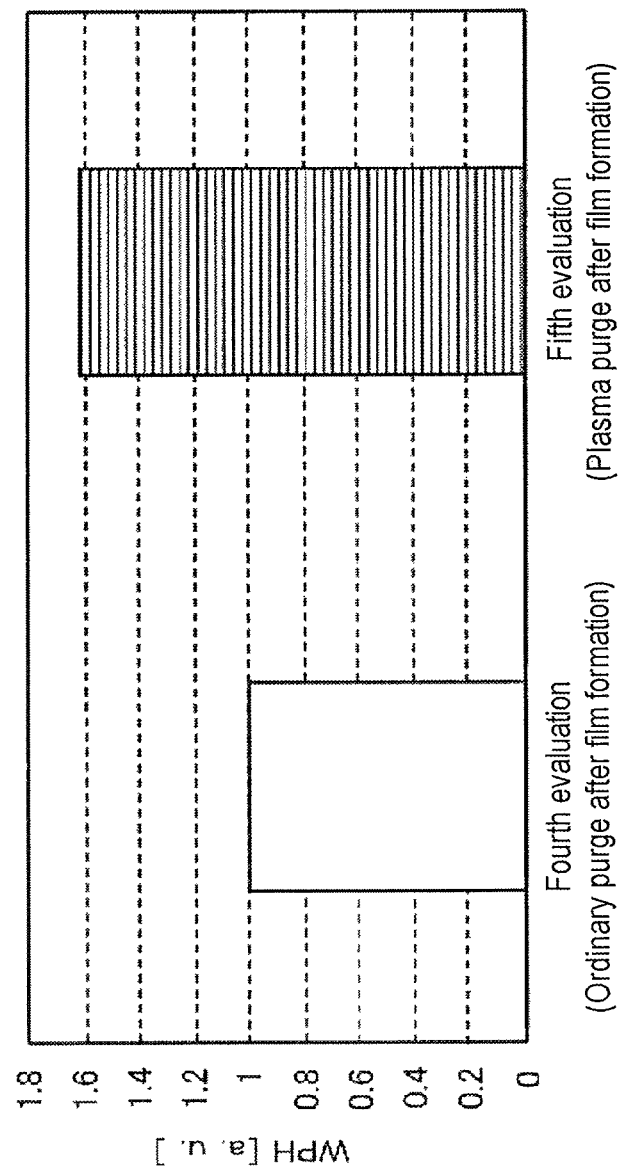
FIG. 12 is a view showing evaluation results on the substrate processing productivity.

FIG. 12 is a view showing the evaluation results on the substrate processing productivity. The horizontal axis in FIG. 12 indicates the fourth and fifth evaluations. The vertical axis in FIG. 12 indicates the WPH. Furthermore, the vertical axis indicates the ratio of the WPH on the basis of the WPH of the fourth evaluation. According to FIG. 12, it can be noted that in the fifth evaluation in which the plasma purge process is performed after the film forming process, the WPH is 1.6 times larger than that of the fourth evaluation in which the ordinary purge process is performed after the film forming process, thereby realizing high productivity.

Figure 13:
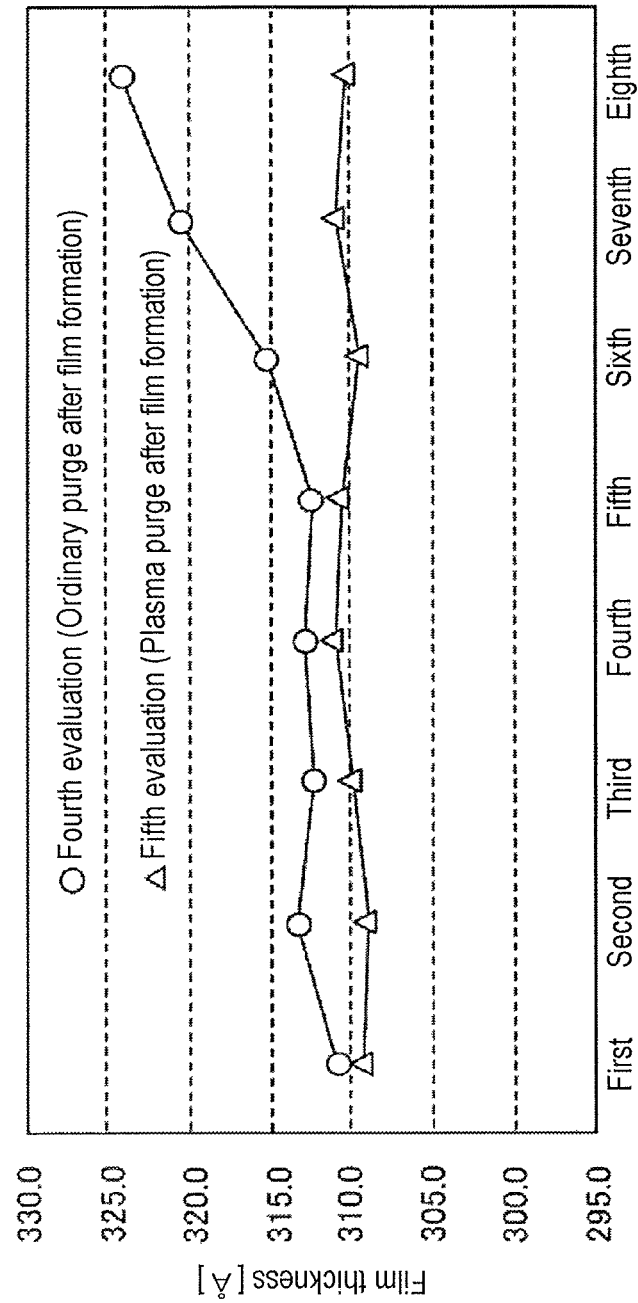
FIG. 13 is a view showing evaluation results on the stability of a deposition rate.

FIG. 13 is a view showing the evaluation results on the deposition rate. The horizontal axis in FIG. 13 indicates the number of performing times of the film forming process. The vertical axis in FIG. 13 indicates the thickness [Å] of the SiO film formed per one film forming process. According to FIG. 13, it can be noted that in the fourth evaluation in which the ordinary purge process is performed after the film forming process, the deposition rate gradually increases as the film forming process is repeated. Presumably, this is because the residue including BTBAS cannot be sufficiently removed from the inner wall of the reaction tube or the like even when the ordinary purge process is performed and because the cumulative residual amount of the residue including BTBAS is increased. In contrast, in the fifth evaluation in which the plasma purge process is performed after the film forming process, the deposition rate is kept substantially constant even when the film forming process is repeated. Presumably, this is because the residue including BTBAS can be sufficiently removed from the inner wall of the reaction tube or the like by performing the plasma purge process. That is to say, it can be noted that the deposition rate can be stabilized more rapidly when the plasma purge process is performed after the film forming process than when the ordinary purge process is performed after the film forming process.

<Preferred Aspects of Present Disclosure>

Hereinafter, some aspects of the present disclosure will be additionally described as supplementary notes.

(Supplementary Note 1)

According to one aspect of the present disclosure, there is provided a method of manufacturing a semiconductor device or a substrate processing method, including forming a film on a substrate in a process chamber by supplying a precursor and a reactant to the substrate under a first temperature at which the precursor and the reactant are not pyrolyzed, and purging, after performing the act of forming the film, an interior of the process chamber by supplying at least one selected from a group consisting of a plasma-excited gas, an alcohol, and a reducing agent into the process chamber under a second temperature equal to or lower than the first temperature.

(Supplementary Note 2)

In the method of Supplementary Note 1, the first temperature may be set at a temperature of 0 degrees C. or more and 150 degrees C. or less. More specifically, the first temperature may be set at a temperature of a room temperature or more and 100 degrees C. or less. Even more specifically, the first temperature may be set at a temperature of 40 degrees C. or more and 90 degrees C. or less.

(Supplementary Note 3)

In the method of Supplementary Note 1 or 2, a plasma-excited oxygen-containing gas may be used as the plasma-excited gas. More specifically, at least one gas selected from a group consisting of an $O_2$ gas, a $N_2O$ gas, a NO gas, a $NO_2$ gas, a $H_2O_2$ gas, and a $H_2O$ gas may be used as the oxygen-containing gas.

(Supplementary Note 4)

In the method of any one of Supplementary Notes 1 to 3, at one selected from a group consisting of isopropyl alcohol, ethanol, and methanol may be used as the alcohol.

(Supplementary Note 5)

In the method of any one of Supplementary Notes 1 to 4, silicon hydride may be used as the reducing agent. More specifically, at one selected from a group consisting of $SiH_4$, $Si_2H_6$, and $Si_3H_8$ may be used as the silicon hydride.

(Supplementary Note 6)

In the method of any one of Supplementary Notes 1 to 5, a plasma-excited hydrogen-containing gas may be used as the reducing agent (the plasma-excited gas). More specifically, at one selected from a group consisting of a $H_2$ gas and a $NH_3$ gas may be used as the hydrogen-containing gas.

(Supplementary Note 7)

In the method of any one of Supplementary Notes 1 to 6, in the act of purging the interior of the process chamber, an internal pressure of the process chamber may be changed. More specifically, in the act of purging the interior of the process chamber, the substance may be intermittently supplied while evacuating the interior of the process chamber. Even more specifically, in the act of purging the interior of the process chamber, the evacuation of the interior of the process chamber and the supply of the substance may be alternately repeated. Even still more specifically, in the act of purging the interior of the process chamber, the interior of the process chamber may be cyclically purged using the substance.

(Supplementary Note 8)

In the method of any one of Supplementary Notes 1 to 7, the act of purging the interior of the process chamber may be performed in a state in which the substrate does not exist in the process chamber.

(Supplementary Note 9)

In the method of any one of Supplementary Notes 1 to 8, the act of purging the interior of the process chamber may be performed in a state in which the substrate exists in the process chamber. More specifically, the act of purging the interior of the process chamber may be performed in a state in which the substrate exists in the process chamber and under a condition in which a film quality of the film formed on the substrate is maintained (not deteriorated).

(Supplementary Note 10)

In the method of any one of Supplementary Notes 1 to 9, an oxidant is used as the reactant.

(Supplementary Note 11)

In the method of Supplementary Note 10, in the act of forming the film on the substrate, a plasma-excited oxygen-containing gas may be used as the oxidant.

(Supplementary Note 12)

In the method of Supplementary Note 11, in the act of forming the film on the substrate, a cycle may be performed a predetermined number of times, the cycle including non-simultaneously performing supplying the precursor to the substrate, and supplying the plasma-excited oxygen-containing gas to the substrate.

(Supplementary Note 13)

In the method of any one of Supplementary Notes 1 to 12, a precursor containing an amino group may be used as the precursor.

(Supplementary Note 14)

In the method of any one of Supplementary Notes 1 to 10, the act of forming the film on the substrate may include supplying a catalyst to the substrate.

(Supplementary Note 15)

In the method of Supplementary Note 14, in the act of forming the film on the substrate, a cycle may be performed a predetermined number of times, the cycle including non-simultaneously performing supplying the precursor and a catalyst to the substrate, and supplying the oxidant and a catalyst to the substrate.

(Supplementary Note 16)

In the method of any one of Supplementary Notes 1 to 15, a precursor containing a halogen group may be used as the precursor.

(Supplementary Note 17)

According to another aspect of the present disclosure, there is provided a substrate processing apparatus, including a process chamber configured to accommodate a substrate, a first supply system configured to supply a precursor to the substrate in the process chamber, a second supply system configured to supply a reactant to the substrate in the process chamber, a third supply system configured to supply at least one selected from a group consisting of a plasma-excited gas, an alcohol, and a reducing agent into the process chamber, a heater configured to heat an interior of the process chamber, and a control part configured to control the first supply system, the second supply system, the third supply system, and the heater so as to perform forming a film on the substrate in the process chamber by supplying the precursor and the reactant to the substrate under a first temperature at which the precursor and the reactant are not pyrolyzed, and purging, after performing the act of forming the film, the interior of the process chamber by supplying at least one selected from a group consisting of the plasma-excited gas, the alcohol, and the reducing agent into the process chamber under a second temperature equal to or lower than the first temperature.

(Supplementary Note 18)

According to a further aspect of the present disclosure, there is provided a program or a non-transitory computer-readable recording medium storing the program, wherein the program causes a computer to perform forming a film on a substrate in a process chamber by supplying a precursor and a reactant to the substrate under a first temperature at which the precursor and the reactant are not pyrolyzed, and purging, after performing the act of forming the film, an interior of the process chamber by supplying at least one selected from a group consisting of a plasma-excited gas, an alcohol, and a reducing agent into the process chamber under a second temperature equal to or lower than the first temperature.

According to the present disclosure in some embodiments, it is possible to enhance the productivity of a substrate processing process and to stabilize a deposition rate or the like.

While certain embodiments have been described, these embodiments have been presented by way of example only, and are not intended to limit the scope of the disclosures. Indeed, the novel methods and apparatuses described herein may be embodied in a variety of other forms, furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
   forming a film on a substrate supported by a substrate support in a process chamber by supplying a precursor and a reactant to the substrate under a temperature at which the precursor and the reactant are is not pyrolyzed;
   unloading the substrate and the substrate support from the process chamber after performing the act of forming the film;
   sealing the process chamber by an opening cover in a state in which the substrate support does not exist within the process chamber after performing the act of unloading the substrate; and
   purging, after performing the act of sealing the process chamber, an interior of the process chamber by supplying a plasma-excited oxygen-containing gas into the process chamber.

2. The method of claim 1, wherein the temperature in the act of forming the film is set at a temperature of 0 degrees C. or more and 150 degrees C. or less.

3. The method of claim 1, wherein in the act of purging the interior of the process chamber, an internal pressure of the process chamber is changed.

4. The method of claim 1, wherein in the act of forming the film, a cycle is performed a predetermined number of times, the cycle including non-simultaneously performing: supplying the precursor; and supplying the plasma-excited oxygen-containing gas.

5. The method of claim 1, wherein the precursor contains an amino group.

6. The method of claim 1, wherein the precursor contains a halogen group.

7. The method of claim 1, wherein a time period for supplying the plasma-excited oxygen-containing gas is two minutes or more and fifteen minutes or less.

8. The method of claim 7, wherein the time period for supplying the plasma-excited oxygen-containing gas is three minutes or more and twelve minutes or less.

9. The method of claim 8, wherein the time period for supplying the plasma-excited oxygen-containing gas is five minutes or more and ten minutes or less.

10. A substrate processing method, comprising:
    forming a film containing oxygen and a predetermined element on a substrate supported by a substrate support in a process chamber by performing:
    supplying a precursor containing the predetermined element to the substrate, under a temperature, the precursor not being pyrolyzed at the temperature; and
    supplying a reactant including a plasma-excited oxygen-containing gas;
    unloading the substrate and the substrate support from the process chamber after performing the act of forming the film;
    sealing the process chamber by an opening cover in a state in which the substrate support does not exist within the process chamber after performing the act of unloading the substrate, and
    purging, after performing the act of sealing the process chamber, an interior of the process chamber supplying a purge gas including the plasma-excited oxygen-containing gas into the process chamber.

11. The method of claim 10, wherein a time period of purging the interior of the process chamber is set longer than a time period of supplying the reactant to the substrate.

12. The method of claim 10, wherein the reactant supplied when forming the film is the same as the purge gas supplied when purging the interior of the process chamber.

13. The method of claim 10, wherein a time period for supplying the plasma-excited oxygen-containing gas is two minutes or more and fifteen minutes or less.

14. The method of claim 13, wherein the time period for supplying the plasma-excited oxygen-containing gas is three minutes or more and twelve minutes or less.

15. The method of claim 14, wherein the time period for supplying the plasma-excited oxygen-containing gas is five minutes or more and ten minutes or less.

16. A method of manufacturing a semiconductor device:
    forming a film on a substrate supported by a substrate support in a process chamber by supplying a precursor and a reactant to the substrate under a temperature at which the precursor is not pyrolyzed;
    unloading the substrate and the substrate support from the process chamber after performing the act of forming the film;
    sealing the process chamber by an opening cover in a state in which the substrate support does not exist within the process chamber after performing the act of unloading the substrate; and
    purging, after performing the act of sealing the process chamber, an interior of the process chamber by supplying a plasma-excited oxygen-containing gas into the process chamber.

17. The method of claim 16, wherein a time period for supplying the plasma-excited oxygen-containing gas is two minutes or more and fifteen minutes or less.

18. The method of claim 17, wherein the time period for supplying the plasma-excited oxygen-containing gas is three minutes or more and twelve minutes or less.

19. The method of claim 18, wherein the time period for supplying the plasma-excited oxygen-containing gas is five minutes or more and ten minutes or less.

* * * * *